(12) United States Patent
Funatsuki et al.

(10) Patent No.: US 11,715,534 B2
(45) Date of Patent: Aug. 1, 2023

(54) SEMICONDUCTOR STORAGE DEVICE CAPABLE OF SELECTIVELY ERASING DATA

(71) Applicant: KIOXIA CORPORATION, Tokyo (JP)

(72) Inventors: Rieko Funatsuki, Yokohama Kanagawa (JP); Takashi Maeda, Kamakura Kanagawa (JP); Reiko Sumi, Yokohama Kanagawa (JP); Reika Tanaka, Yokohama Kanagawa (JP); Masumi Saitoh, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 20 days.

(21) Appl. No.: 17/459,441

(22) Filed: Aug. 27, 2021

(65) Prior Publication Data

US 2022/0301643 A1 Sep. 22, 2022

(30) Foreign Application Priority Data

Mar. 16, 2021 (JP) .................................. 2021-042326

(51) Int. Cl.
*G11C 16/34* (2006.01)
*G11C 16/14* (2006.01)
(Continued)

(52) U.S. Cl.
CPC ...... *G11C 16/3445* (2013.01); *G11C 16/0433* (2013.01); *G11C 16/08* (2013.01);
(Continued)

(58) Field of Classification Search
CPC .............. G11C 16/3445; G11C 16/344; G11C 16/3436; G11C 16/345; G11C 16/3468;
(Continued)

(56) References Cited

U.S. PATENT DOCUMENTS 7,590,005 B2 * 9/2009 Hsu .................... G11C 16/0466
365/185.24
2011/0051527 A1 3/2011 Kirisawa et al.
(Continued)

FOREIGN PATENT DOCUMENTS

| JP | 2011054234 A | 3/2011 |
| JP | 2013004127 A | 1/2013 |

*Primary Examiner* — Kretelia Graham
(74) *Attorney, Agent, or Firm* — Kim & Stewart LLP

(57) ABSTRACT

A semiconductor storage device includes a memory cell array including a plurality of memory strings, each connected between one of a plurality of bit lines and a source line and includes a first select transistor, a second select transistor, and memory cell transistors that are connected in series between the first select transistor and the second select transistor, and a plurality of word lines respectively connected to gates of the memory cell transistors in each memory string. A threshold voltage of the memory cell transistor is increased when a voltage that is applied to the word line connected to the gate thereof is lower than a voltage of a channel thereof. In the erase operation, data stored in the memory cell transistors connected to a selected one of the word lines are erased while data stored in the memory cell transistors not connected to the selected word line are not erased.

20 Claims, 23 Drawing Sheets

(51) Int. Cl.
  *G11C 16/08* (2006.01)
  *G11C 16/24* (2006.01)
  *G11C 16/26* (2006.01)
  *G11C 16/04* (2006.01)

(52) U.S. Cl.
  CPC .............. *G11C 16/14* (2013.01); *G11C 16/24* (2013.01); *G11C 16/26* (2013.01); *G11C 16/3404* (2013.01)

(58) Field of Classification Search
  CPC ............ G11C 16/3472; G11C 16/3477; G11C 16/0433; G11C 16/0483; G11C 16/06; G11C 16/14; G11C 16/16; G11C 16/08; G11C 16/24; G11C 16/26; G11C 11/22; G11C 11/221; G11C 11/223; G11C 11/225; G11C 11/2253; G11C 11/2255; G11C 11/2259; G11C 11/2273; G11C 11/2275; G11C 11/2277; G11C 11/2293; G11C 11/2295; G11C 11/2297
  See application file for complete search history.

(56) References Cited

U.S. PATENT DOCUMENTS

2012/0320698 A1    12/2012  Itagaki et al.
2022/0101926 A1*    3/2022  Oowada ................. G11C 16/26

\* cited by examiner ns during the erase operation of the second
SEMICONDUCTOR STORAGE DEVICE CAPABLE OF SELECTIVELY ERASING DATA

CROSS-REFERENCE TO RELATED APPLICATION

This application is based upon and claims the benefit of priority from Japanese Patent Application No. 2021-042326, filed Mar. 16, 2021, the entire contents of which are incorporated herein by reference.

FIELD

Embodiments described herein relate generally to a semiconductor storage device.

BACKGROUND

A semiconductor storage device includes a plurality of memory cell transistors for storing data. Data writing and reading to and from the memory cell transistors can be performed individually for each memory cell transistor. On the other hand, data erasing is generally performed for a plurality of memory cells collectively, for example, for each unit called a block.

DETAILED DESCRIPTION

Some memory cell transistors have their threshold voltages raised when a voltage is applied to a gate that is lower than a voltage of a channel. For example, memory cell transistors utilize spontaneous polarization of a ferroelectric layer. Even in a semiconductor storage device having such a memory cell transistor, it is preferable that data can be selectively erased instead of being erased collectively.

According to the disclosed embodiments, a semiconductor storage device capable of selectively erasing data is provided.

In general, according to one embodiment, there is provided a semiconductor storage device including a memory cell array including a plurality of first memory strings, each of which is connected between one of a plurality of bit lines and a source line and includes a first select transistor, a second select transistor, and a plurality of memory cell transistors that are connected in series between the first select transistor and the second select transistor, the memory cell array further including a plurality of word lines respectively connected to gates of the memory cell transistors in each first memory string and a control circuit configured to control an operation of the memory cell array, including an erase operation. A threshold voltage of the memory cell transistor is increased when a voltage that is applied to the word line connected to the gate thereof is lower than a voltage of a channel thereof. In the erase operation, data stored in the memory cell transistors connected to a selected one of the word lines are erased while data stored in the memory cell transistors not connected to the selected word line are not erased.

Hereinafter, the present embodiments will be described with reference to the accompanying drawings. In order to facilitate understanding of the description, the same components are denoted by the same reference signs as much as possible in each drawing, and duplicate description is omitted.

Figure 1:
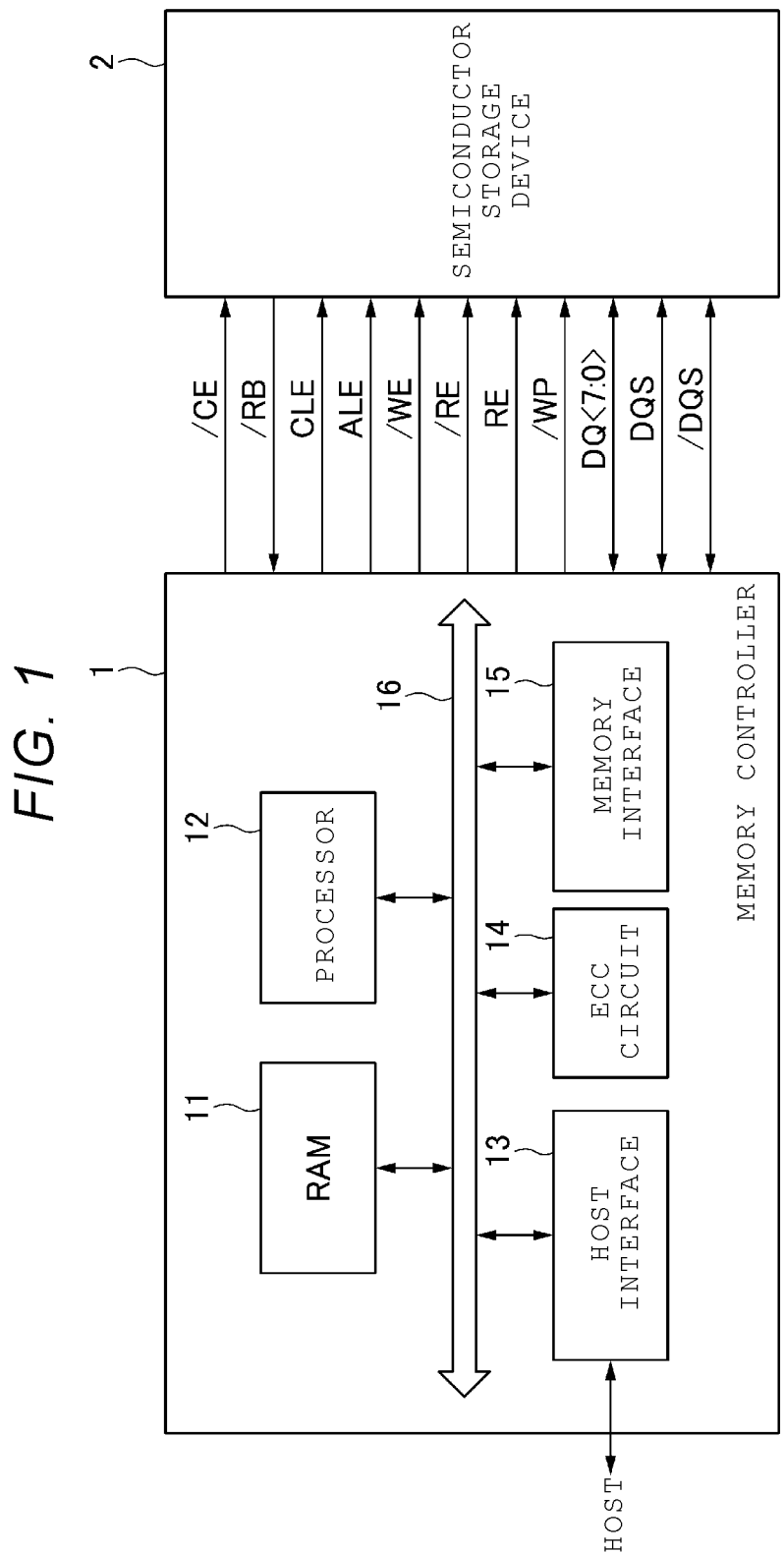
FIG. 1 is a block diagram illustrating a configuration example of a memory system according to a first embodiment.

A first embodiment will be described. A semiconductor storage device 2 according to the present embodiment is a non-volatile storage device configured as a ferroelectric random access memory (FeRAM). FIG. 1 illustrates a configuration example of a memory system including the semiconductor storage device 2 in a block diagram. The memory system includes a memory controller 1 and the semiconductor storage device 2. A specific configuration of the semiconductor storage device 2 will be described later. The memory system of FIG. 1 can be connected to a host (not illustrated). The host is, for example, an electronic device such as a personal computer or a mobile terminal.

The memory controller 1 controls writing of data to the semiconductor storage device 2 according to a write request from the host. In addition, the memory controller 1 controls reading of data from the semiconductor storage device 2 according to a read request from the host.

A chip enable signal /CE, a ready busy signal /RB, a command latch enable signal CLE, an address latch enable signal ALE, a write enable signal /WE, read enable signals /RE and RE, a write protect signal /WP, a data signal DQ<7:0>, and data strobe signals DQS and /DQS are transmitted and received between the memory controller 1 and the semiconductor storage device 2.

The chip enable signal /CE is a signal for enabling the semiconductor storage device 2. The ready busy signal /RB is a signal for indicating whether the semiconductor storage device 2 is in a ready state or a busy state. The "ready state" is a state in which an external command can be received. The "busy state" is a state in which the external command cannot be received. The command latch enable signal CLE is a signal indicating that the signal DQ<7:0> is a command. The address latch enable signal ALE is a signal indicating that the signal DQ<7:0> is an address. The write enable signal /WE is a signal for capturing the received signal into the semiconductor storage device 2. In a single data rate (SDR) mode, it is instructed to capture the signal DQ<7:0> as a command, an address, or data transmitted to the semiconductor storage device 2 at the rising edge of the signal /WE. In addition, in a double data rate (DDR) mode, it is instructed to capture the signal DQ<7:0> as a command or an address transmitted to the semiconductor storage device 2 at the rising edge of the signal /WE. It is asserted each time a command, an address, and data are received by the memory controller 1.

The read enable signal /RE is a signal for the memory controller 1 to read data from the semiconductor storage device 2. The signal RE is a complementary signal of the signal /RE. The signals are used, for example, to control an operation timing of the semiconductor storage device 2 when outputting the signal DQ<7:0>. More specifically, in the single data rate mode, it is instructed to output the signal DQ<7:0> as data to the semiconductor storage device 2 at the falling edge of the signal /RE. In addition, in the double data rate mode, it is instructed to output the signal DQ<7:0> as data to the semiconductor storage device 2 at the falling edge and the rising edge of the signal /RE. The write protect signal /WP is a signal for instructing the semiconductor storage device 2 to prohibit data writing and erasing. The signal DQ<7:0> is transmitted and received between the semiconductor storage device 2 and the memory controller 1 and includes commands, addresses, or data. The data strobe signal DQS is a signal for controlling an input/output timing of the signal DQ<7:0>. The signal /DQS is a complementary signal of the signal DQS. More specifically, in the double data rate mode, it is instructed to capture the signal DQ<7:0> as data into the semiconductor storage device 2 at the falling edge and the rising edge of the signal DQS. In addition, in the double data rate mode, the signal DQS is generated based on the falling edge and the rising edge of the signal /RE and is output from the semiconductor storage device 2 together with the signal DQ<7:0> as data.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to each other via an internal bus 16.

The host interface 13 outputs a request, user data (e.g., write data), and the like received from the host to the internal bus 16. In addition, the host interface 13 transmits the user data read from the semiconductor storage device 2, a response from the processor 12, and the like to the host.

The memory interface 15 controls a process of writing the user data or the like to the semiconductor storage device 2 and a process of reading the user data from the semiconductor storage device 2 based on an instruction of the processor 12.

The processor 12 controls the memory controller 1. The processor 12 is, for example, a CPU, an MPU, or the like. When the processor 12 receives the request from the host via the host interface 13, the processor 12 performs control according to the request. For example, the processor 12 instructs the memory interface 15 to write the user data and a parity to the semiconductor storage device 2 according to the request from the host. In addition, the processor 12 instructs the memory interface 15 to read the user data and the parity from the semiconductor storage device 2 according to the request from the host.

The processor 12 determines a storage region (also referred to as a memory region) in the semiconductor storage device 2 with respect to the user data stored in the RAM 11. The user data is stored in the RAM 11 via the internal bus 16. The processor 12 determines the memory region for page-based data (page data), where one page is a unit of writing. The user data stored in one page of the semiconductor storage device 2 is also referred to as "unit data", hereinafter. The unit data is generally encoded and stored in the semiconductor storage device 2 as a code word. In the present embodiment, the encoding is optional. The memory controller 1 may store the unit data in the semiconductor storage device 2 without encoding, but FIG. 1 illustrates a configuration in which encoding is performed as a configuration example. When the memory controller 1 does not encode, the page data matches the unit data. In addition, one code word may be generated based on one unit data, or one code word may be generated based on divided data obtained by dividing the unit data. In addition, one code word may be generated by using a plurality of items of unit data.

The processor 12 determines the memory region of the semiconductor storage device 2 of a write destination for each unit data. A physical address is allocated to the memory region of the semiconductor storage device 2. The processor 12 manages the memory region of the write destination of the unit data by using the physical address. The processor 12 designates the determined memory region (e.g., in the form of a physical address) and instructs the memory interface 15 to write the user data to the semiconductor storage device 2. The processor 12 manages the correspondence between a logical address (in particular, the logical address managed by the host) of the user data and the physical address. When the processor 12 receives a read request including the logical address from the host, the processor 12 determines the physical address corresponding to the logical address, designates the physical address, and instructs the memory interface 15 to read the user data.

The ECC circuit 14 encodes the user data stored in the RAM 11 to generate the code word. In addition, the ECC circuit 14 decodes the code word read from the semiconductor storage device 2.

The RAM 11 temporarily stores the user data received from the host until the user data is stored in the semiconductor storage device 2 or temporarily stores the data read from the semiconductor storage device 2 until the data is transmitted to the host. The RAM 11 is, for example, a general-purpose memory such as an SRAM or a DRAM.

FIG. 1 illustrates a configuration example in which the memory controller 1 includes the ECC circuit 14 and the memory interface 15, separately. However, the ECC circuit 14 may be incorporated in the memory interface 15. In addition, the ECC circuit 14 may be incorporated in the semiconductor storage device 2. The specific configuration and arrangement of each element illustrated in FIG. 1 are not particularly limited to those illustrated.

When the write request is received from the host, the memory system of FIG. 1 operates as follows. The processor 12 temporarily stores the data that is a write target in the RAM 11. The processor 12 reads the data stored in the RAM 11 and inputs the data to the ECC circuit 14. The ECC circuit 14 encodes the input data and inputs the code word to the memory interface 15. The memory interface 15 writes the code word to the semiconductor storage device 2.

When the read request is received from the host, the memory system of FIG. 1 operates as follows. The memory interface 15 inputs the code word read from the semiconductor storage device 2 to the ECC circuit 14. The ECC circuit 14 decodes the code word and stores the decoded data in the RAM 11. The processor 12 transmits the data stored in the RAM 11 to the host via the host interface 13.

Figure 2:
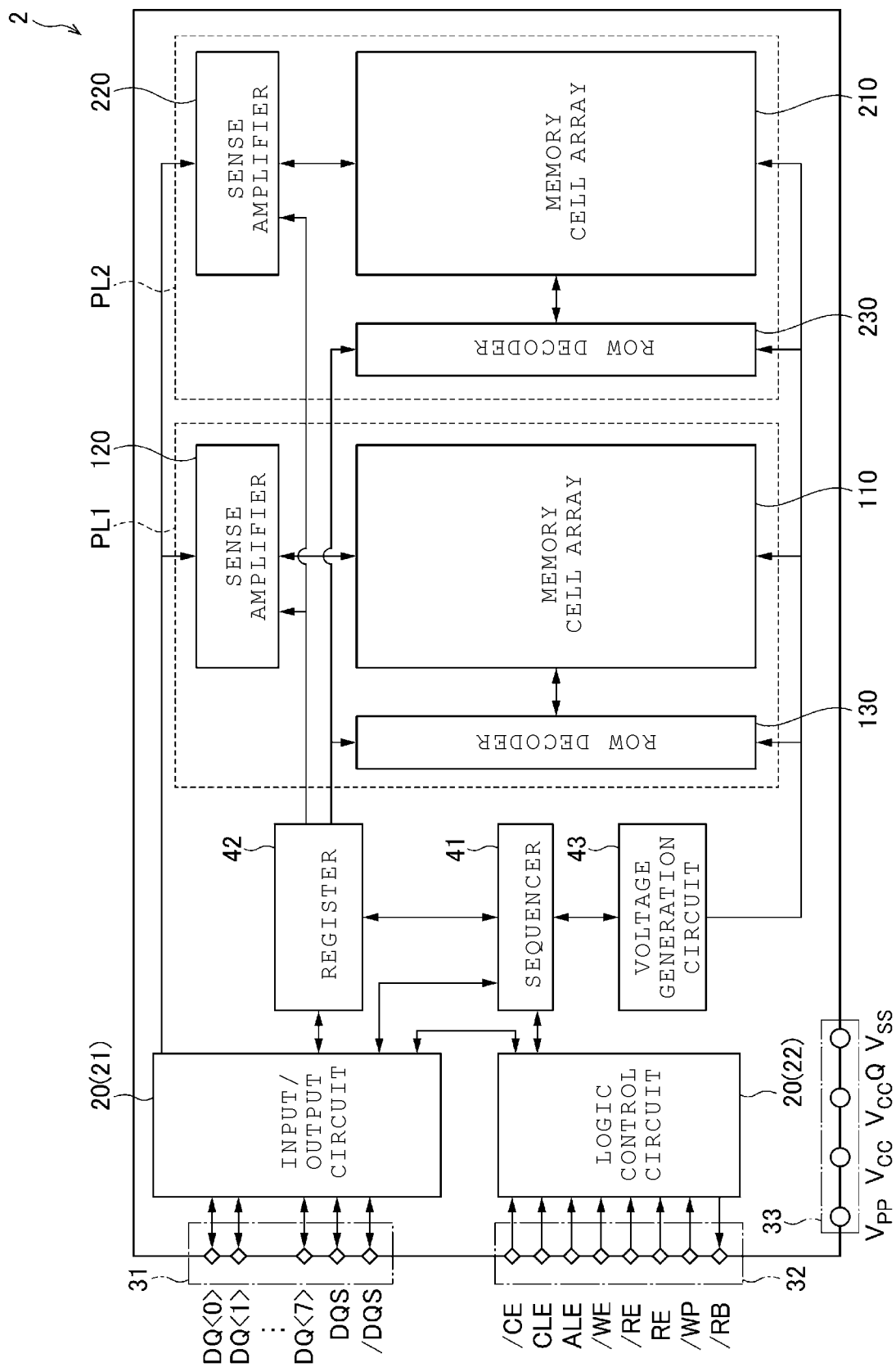
FIG. 2 is a block diagram illustrating a configuration of a semiconductor storage device according to the first embodiment.

A configuration of the semiconductor storage device 2 will be described with reference mainly to FIG. 2. As illustrated in the figure, the semiconductor storage device 2 includes two planes PL1 and PL2, an input/output circuit 21, a logic control circuit 22, a sequencer 41, a register 42, a voltage generation circuit 43, and a pad group 31 for input/output, a pad group 32 for logic control, and a terminal group 33 for power input.

The plane PL1 includes a memory cell array 110, a sense amplifier 120, and a row decoder 130. In addition, the plane PL2 includes a memory cell array 210, a sense amplifier 220, and a row decoder 230. The configuration of the plane PL1 and the configuration of the plane PL2 are the same. That is, the configuration of the memory cell array 110 and the configuration of the memory cell array 210 are the same, the configuration of the sense amplifier 120 and the configuration of the sense amplifier 220 are the same, and the configuration of the row decoder 130 and the configuration of the row decoder 230 are the same. The number of planes provided in the semiconductor storage device 2 may be two as in the present embodiment, but may be three or more. In addition, the semiconductor storage device 2 may be provided with only one plane.

The memory cell array 110 and the memory cell array 210 are portions for storing data. Each of the memory cell array 110 and the memory cell array 210 includes a plurality of memory cell transistors associated with word lines and bit lines. These specific configurations will be described later.

The input/output circuit 21 transmits and receives the signal DQ<7:0> and the data strobe signals DQS and/DQS to and from the memory controller 1. The input/output circuit 21 transmits the command and the address in the signal DQ<7:0> to the register 42. In addition, the input/output circuit 21 transmits and receives a write data and a read data to and from the sense amplifier 120 and the sense amplifier 220.

The logic control circuit 22 receives the chip enable signal /CE, the command latch enable signal CLE, the address latch enable signal ALE, the write enable signal /WE, the read enable signals /RE and RE, and the write protect signal /WP from the memory controller 1. In addition, the logic control circuit 22 transmits the ready busy signal /RB to the memory controller 1 to notify the state of the semiconductor storage device 2 to the outside.

Each one of the input/output circuit 21 and the logic control circuit 22 is a circuit that inputs and outputs signals to and from the memory controller 1. The input/output circuit 21 and the logic control circuit 22 are collectively referred to as an "interface circuit 20", hereinafter. The interface circuit 20 can be said to be a portion that inputs and outputs signals including control signals related to the operations of the planes PL1 and PL2. The above-mentioned "control signal" is, for example, the commands and the addresses in the signal DQ<7:0> input to the input/output circuit 21, the command latch enable signal CLE input to the logic control circuit 22, and the like.

The sequencer 41 controls the operations of the respective portions of the memory cell arrays 110 and 210 and the like based on the control signals input from the memory controller 1 to the interface circuit 20. The sequencer 41 corresponds to the "control circuit" in this embodiment. Both the sequencer 41 and the logic control circuit 22 may also be regarded as the "control circuit" in the present embodiment.

The register 42 is a portion that temporarily stores a command or an address. A command for instructing a write operation, an erase operation, or the like of the planes PL1 and PL2 and an address corresponding to the command are input to the input/output circuit 21 from the memory controller 1 and, after that, the command and the address are transmitted from the input/output circuit 21 to the register 42 to be stored in the register 42.

The register 42 also serves as a portion storing status information indicating the state of the semiconductor storage device 2. The sequencer 41 updates the status information stored in the register 42. The status information is output from the input/output circuit 21 to the memory controller 1 as a status signal according to the request from the memory controller 1.

The voltage generation circuit 43 is a portion that generates respective voltages required for the write operation, the read operation, and the erase operation of the data in the memory cell arrays 110 and 210 based on the instruction from the sequencer 41. The voltages include, for example, a voltage applied to a word line WL, a voltage applied to a bit line BL, and the like, which are described later.

The pad group 31 for input/output is a portion provided with a plurality of terminals (also referred to as pads) for transmitting and receiving each signal between the memory controller 1 and the input/output circuit 21. The respective terminals are individually provided corresponding to each of the signal DQ<7:0> and the data strobe signals DQS and/DQS.

The pad group 32 for logic control is a portion provided with a plurality of terminals (also referred to as pads) for transmitting and receiving each signal between the memory controller land the logic control circuit 22. The respective terminals are individually provided corresponding to the chip enable signal /CE, the command latch enable signal CLE, the address latch enable signal ALE, the write enable signal /WE, the read enable signals /RE and RE, the write protect signal /WP, and the ready busy signal /RB, respectively.

The terminal group 33 for power input is a portion provided with a plurality of terminals for receiving application of the respective voltages required for the operations of the semiconductor storage device 2. The voltages applied to the respective terminals include power supply voltages Vcc, VccQ, and Vpp, and a ground voltage Vss.

The power supply voltage Vcc is a circuit power supply voltage supplied from the outside as an operating power supply and is, for example, a voltage of about 3.3 V. The power supply voltage VccQ is, for example, a voltage of 1.2 V. The power supply voltage VccQ is a voltage used when transmitting and receiving signals between the memory controller 1 and the semiconductor storage device 2. The power supply voltage Vpp is a power supply voltage higher than the power supply voltage Vcc and is, for example, a voltage of 12 V.

The configurations of the planes PL1 and PL2 will be described. It is noted that, as described above, the configuration of the plane PL1 and the configuration of the plane PL2 are the same as each other. For this reason, hereinafter, only the configuration of the plane PL1 will be described, and the illustration and description of the configuration of the plane PL2 will be omitted.

Figure 3:
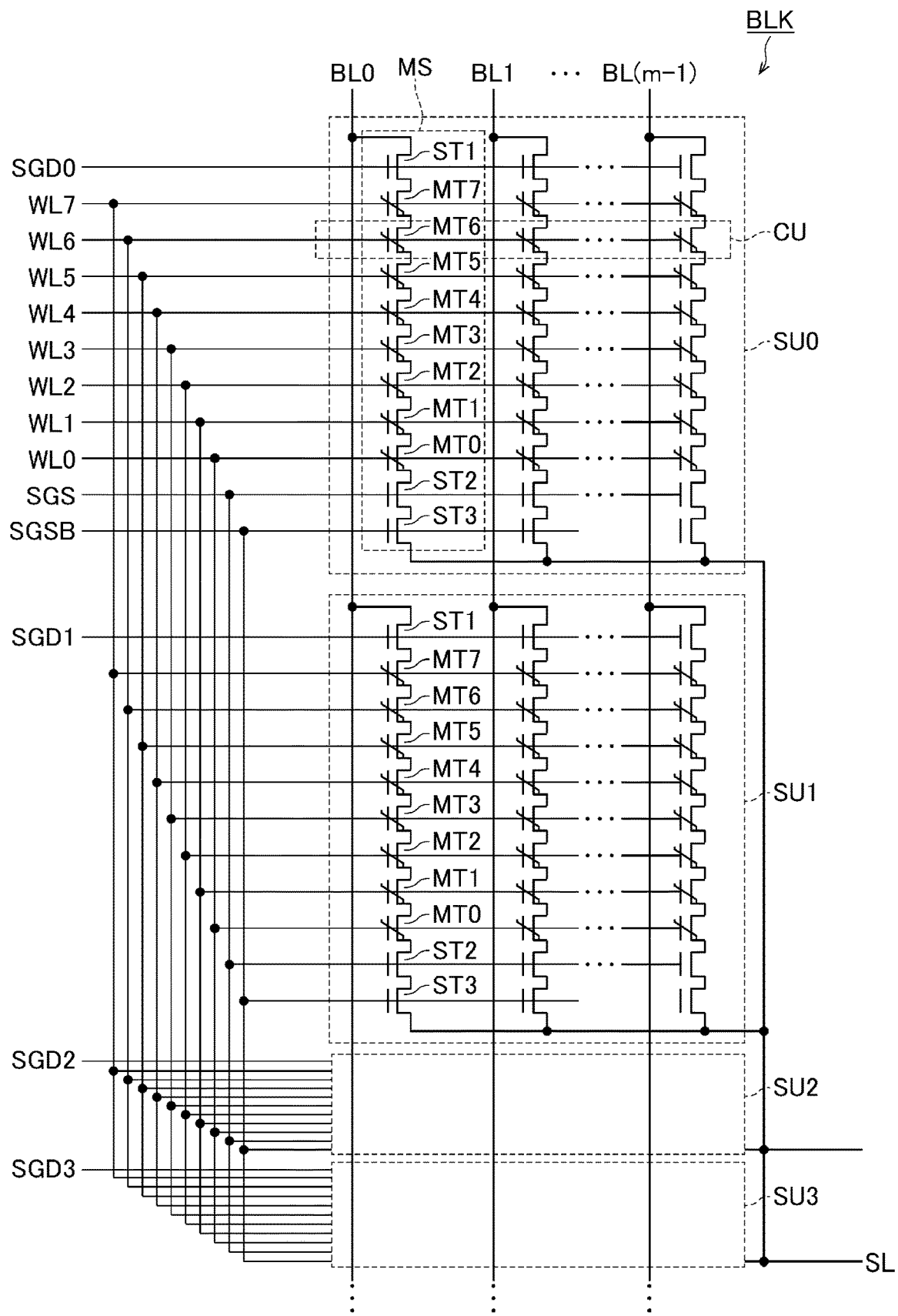
FIG. 3 is an equivalent circuit diagram illustrating a configuration of a memory cell array.

FIG. 3 illustrates the configuration of the memory cell array 110 provided on the plane PL1 as an equivalent circuit diagram. Although the memory cell array 110 is configured with a plurality of blocks BLK, only one of these blocks BLK is illustrated in FIG. 3. The configuration of the other blocks BLK in the memory cell array 110 is also the same as that illustrated in FIG. 3.

As illustrated in FIG. 3, the block BLK includes, for example, four string units SU (SU0 to SU3). In addition, each string unit SU includes a plurality of memory strings MS. As described above, the memory cell array 110 includes the plurality of memory strings MS, and each memory string MS belongs to one of the plurality of string units SU. The number of string units SU may be different from that in the example of FIG. 3.

Each memory string MS includes, for example, eight memory cell transistors MT (MT0 to MT7), a first select transistor ST1, a second select transistor ST2, and a third select transistor ST3, which are configured to be connected in series.

It is noted that the number of memory cell transistors MT in each memory string MS is not limited to eight and may be, for example, 32, 48, 64, or 96. For example, in order to enhance a cutoff characteristic, each or any of the first select transistor ST1, the second select transistor ST2, and the third select transistor ST3 may be configured with a plurality of transistors instead of a single transistor. In addition, the configuration may be such that the third select transistor ST3 is omitted. Furthermore, a dummy cell transistor may be provided between the memory cell transistor MT and the first select transistor ST1 or between the memory cell transistor MT and the second select transistor ST2.

The memory cell transistors MT are connected in series with each other between the first select transistor ST1 and the second select transistor ST2. The memory cell transistor MT7 on one end side is connected to the source of the first select transistor ST1, and the memory cell transistor MT0 on the other end side is connected to the drain of the second select transistor ST2.

The memory cell array 110 is provided with m bit lines BL (BL0, BL1, . . . , BL(m−1)). The above "m" is an integer representing the number of memory strings MS in one string unit SU.

Among the plurality of memory strings MS, the memory strings MS belonging to the same string unit SU are connected to different bit lines BL via the first select transistor ST1. In addition, the gates of the respective first select transistors ST1 belonging to the same string unit SU are commonly connected to gate lines SGD0 to SGD3 individually provided for the respective string units SU. For example, the gates of the respective first select transistors ST1 belonging to the string unit SU0 are commonly connected to the gate line SGD0 provided corresponding to the string unit SU0.

The same applies to the gates of the respective first select transistors ST1 belonging to the other string unit SU1 and the like, which are commonly connected to the gate lines provided corresponding to the string unit SU. It is noted that the gate line SGD0 is a gate line provided corresponding to the string unit SU0, the gate line SGD1 is a gate line provided corresponding to the string unit SU1, the gate line SGD2 is a gate line provided corresponding to the string unit SU2, and the gate line SGD3 is a gate line provided corresponding to the string unit SU3. Each of the gate lines SGD0, SGD1, SGD2, and SGD3 is referred to as the "first gate line" in the present embodiment.

In each string unit SU, the source of the second select transistor ST2 is connected to the drain of the third select transistor ST3. The source of the third select transistor ST3 is connected to a source line SL. The source line SL is commonly connected to each of the sources of the plurality of second select transistors ST2 in the block BLK. In this manner, the plurality of memory strings MS are commonly connected to the same source line SL via the second select transistor ST2 and the third select transistor ST3, respectively. As described above, the third select transistor ST3 may be omitted. In this case, the source of the respective second select transistors ST2 is commonly connected to the source line SL.

The gates of the respective second select transistors ST2 in the block BLK are commonly connected to the same gate line SGS. The gate line SGS is referred to as the "second gate line" in the present embodiment.

Similarly, the gates of the respective third select transistors ST3 in the block BLK are commonly connected to the same gate line SGSB. The gate line SGSB is referred to as a "third gate line" in the present embodiment.

Gates of memory cell transistors MT0 in the same block BLK are commonly connected to a word line WL0. In addition, gates of memory cell transistors MT1 in the same block BLK are commonly connected to a word line WL1. The same applies to the other memory cell transistors MT. That is, the gates of the memory cell transistors MT0 to MT7 are commonly connected to the word line WL (any one of WL0 to WL7) provided corresponding to each of the gates of the memory cell transistors MT0 to MT7.

Figure 4:
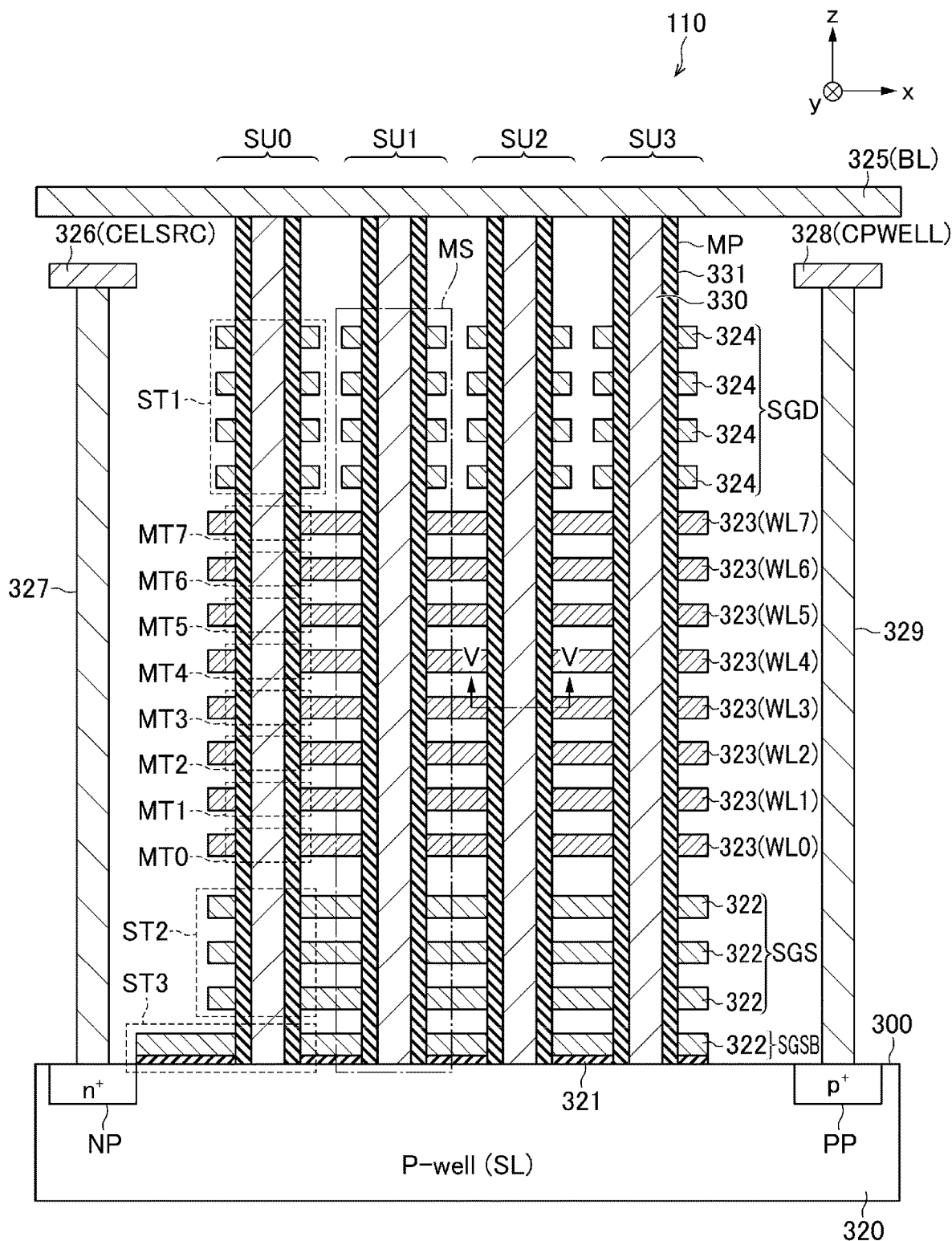
FIG. 4 is a cross-sectional view illustrating the configuration of the memory cell array.

It is noted that, as illustrated in FIG. 4 described later, a plurality of memory cell transistors MTn (n is an any integer of 0 to 7) belonging to different string units SU are provided at the same height position in the semiconductor storage device 2. For example, the memory cell transistor MT0 of the string unit SU0 and the memory cell transistor MT0 of the string unit SU1 are provided at the same height position in the semiconductor storage device 2. Therefore, it can be said that, among the memory cell transistors MT, the gates of the memory cell transistors MT at the same height position are commonly connected to the same word line WL.

A set of the plurality of memory cell transistors MT connected to a common word line WL in one string unit SU is referred to as, for example, a cell unit CU. The set of 1-bit data stored in each memory cell transistor MT of one cell unit CU is referred to as a "page". In the present embodiment, as described later, the 1-bit data is stored in each memory cell transistor MT. For this reason, data for one page is stored in each cell unit CU. Alternatively, data for a plurality of pages may be stored in each cell unit CU.

FIG. 4 is an example of the cross-sectional structure of the memory cell array 110, and the structure corresponding to one block BLK is extracted and illustrated.

In the cross-sectional view of FIG. 4, some components such as an insulating layer (e.g., interlayer insulating film), wirings, and contacts are appropriately omitted for simplifying the figure. In addition, the x direction illustrated in FIG. 4 corresponds to the extending direction of the bit line BL. The y direction corresponds to the extending direction of the word line WL. The z direction corresponds to the direction perpendicular to the surface of a semiconductor substrate 300 on which the semiconductor storage device 2 is formed.

As illustrated in FIG. 4, for example, a p-type well region 320, an insulator layer 321, four layers of conductive layers 322, and eight layers of conductive layers 323, four layers of conductive layers 324, a plurality of memory pillars MP, conductive layers 325, 326, and 328, and contacts 327 and 329 are provided in the region of the semiconductor substrate 300 where the memory cell array 110 is formed. It is noted that an insulating layer (not illustrated) is formed between the respective conductive layers.

The p-type well region 320 is provided near the surface of the semiconductor substrate 300. The p-type well region 320 is used as the source line SL. The p-type well region 320 includes an n+ impurity diffusion region NP and a p+ impurity diffusion region PP which are disposed apart from each other. Each of the n+ impurity diffusion region NP and the p+ impurity diffusion region PP is provided near the surface of the p-type well region 320.

The insulator layer 321 is provided on the p-type well region 320. The four layers of the conductive layers 322 stacked apart from each other are provided on the insulator layer 321. The eight layers of the conductive layers 323 stacked apart from each other are provided above the uppermost conductive layers 322. The four layers of the conductive layers 324 stacked apart from each other are provided above the conductive layers 323. The conductive layer 325 is provided above the uppermost conductive layers 324.

Each conductive layers 322 has a structure extending along the xy plane. The conductive layer 322 provided on the lowermost side is used as the gate line SGSB. The three conductive layers 322 provided on the upper side thereof are used as the gate lines SGS. In the example of FIG. 4, three second select transistors ST2 and one third select transistor ST3 are provided. The number of conductive layers 322 provided is the same as the total number of the second select transistors ST2 and the third select transistors ST3.

The conductive layers 323 have a structure extending along the xy plane. The eight layers of conductive layers 323 are used as word lines WL0, WL1, WL2, WL7, respectively, in order from the lowermost layer.

The conductive layers 324 have a structure extending along the y direction. The conductive layers 324 are used as a select gate line SGD. In the example of FIG. 4, three first select transistors ST1 are provided. The number of conductive layers 324 provided is the same as the total number of the first select transistors ST1.

The conductive layer 325 has a structure extending in the x direction. The conductive layer 325 is used as the bit line BL. The plurality of conductive layers 325 are arranged along the y direction.

Each of the memory pillars MP corresponds to one memory string MS. The memory pillars MP are arranged along each of the x-direction and the y-direction. As illustrated in FIG. 4, each of the memory pillars MP arranged along the x direction is connected to the same conductive layer 325 (that is, the same bit line BL).

Each of the memory pillars MP arranged along the y direction is connected to different conductive layers 325 (that is, connected to different bit lines BL). As illustrated in FIG. 4, a group of the memory pillars MP arranged along the y direction belong to the same string unit SU.

Each of the memory pillars MP penetrates the insulator layer 321, the four layers of conductive layers 322, the eight layers of conductive layers 323, and the four layers of conductive layers 324, respectively. Any one of the portions of the memory pillars MP that intersect with the respective conductive layers described above forms a transistor. Among the plurality of transistors, the transistors located at the portion intersecting the conductive layers 322 function as the third select transistor ST3 and the second select transistor ST2. Among the plurality of transistors, the transistors located at the portion intersecting the conductive layers 323 function as the memory cell transistors MT (MT0 to MT7). Among the plurality of transistors, the transistor located at the portion intersecting the conductive layers 324 functions as the first select transistor ST1.

Each of the memory pillars MP includes a semiconductor film 330 and a ferroelectric film 331. The semiconductor film 330 is formed, for example, in a columnar shape extending along the z direction. The ferroelectric film 331 is a film made of a ferroelectric material and covers a side surface of the semiconductor film 330.

Figure 5:
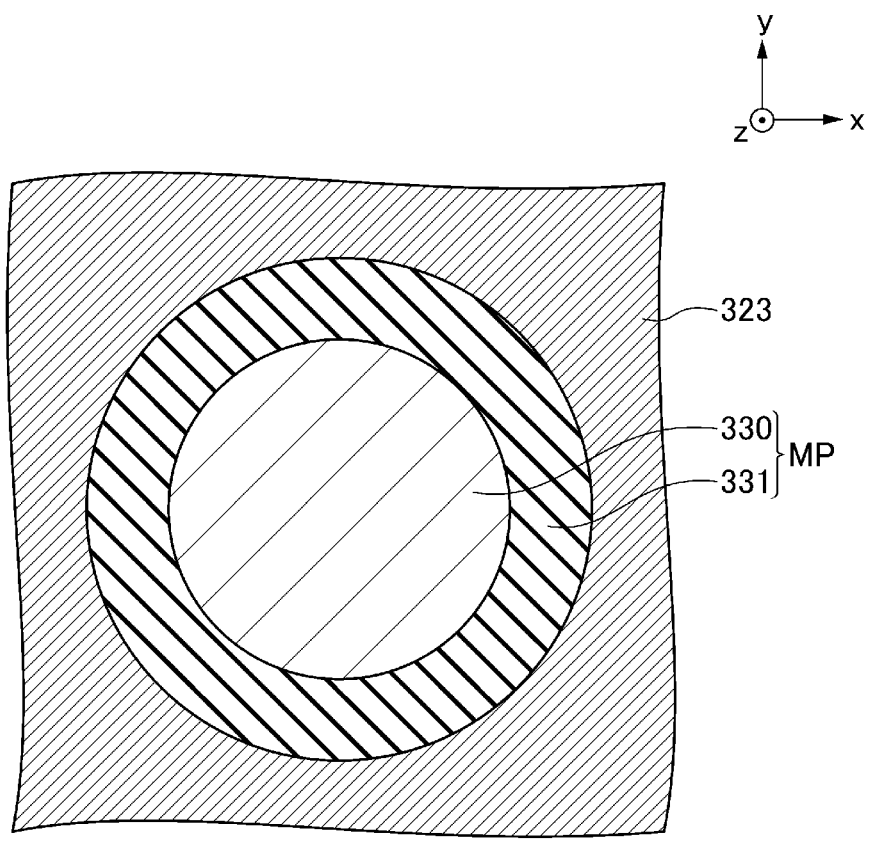
FIG. 5 is a diagram illustrating a cross section taken along line V-V in FIG. 4.

FIG. 5 is a diagram illustrating a cross section taken along line V-V in FIG. 4 and illustrating an example of the cross-sectional structure of the memory pillars MP in the layer including the conductive layers 323.

As illustrated in FIG. 5, in the layers including the conductive layers 323, the semiconductor film 330 is provided, for example, in the central portion of the memory pillar MP. The ferroelectric film 331 covers the side surface of the semiconductor film 330 around the entire circumference. The conductive layer 323 that functions as the word line WL covers the outer peripheral surface of the ferroelectric film 331 around the entire circumference. It is noted that an insulator film may be buried inside the semiconductor film 330.

Returning to FIG. 4, the description will be continued. The lower end of the semiconductor film 330 in the memory pillars MP is in contact with the p-type well region 320. The upper portion of the semiconductor film 330 is in contact with the conductive layer 325. It is noted that the upper portion of the semiconductor film 330 and the conductive layer 325 may be electrically connected via contacts, wirings, and the like.

The semiconductor film 330 is formed of, for example, undoped polysilicon. The semiconductor film 330 is a portion that functions as a channel of the memory string MS. The ferroelectric film 331 is formed of a ferroelectric material such as hafnium dioxide ($HfO_2$). The ferroelectric film 331 functions as a block insulating film of the transistor. The ferroelectric film 331 changes the direction and magnitude of spontaneous polarization according to the magnitude of the voltage applied to the conductive layer 323 (that is, the word line WL). As described later, data is stored in the memory cell transistor MT by utilizing such polarization reversal.

The conductive layer 326 is disposed, for example, in a wiring layer between the uppermost conductive layers 324 and the conductive layer 325 and is used as a CELSRC. The CELSRC is used as a wiring for changing the voltage of the p-type well region 320. The conductive layer 326 is electrically connected to the n+ impurity diffusion region NP via the contact 327.

The conductive layer 328 is disposed, for example, in the wiring layer between the uppermost conductive layers 324 and the conductive layer 325 and is used as a CPWELL. The CPWELL is used as a wiring for changing the voltage of the p-type well region 320. The conductive layer 328 is electrically connected to the p+ impurity diffusion region PP via the contact 329.

The lowermost conductive layers 322 and the insulator layer 321 extend to the vicinity of the n+ impurity diffusion region NP. Accordingly, when the second transistor ST2 and the third select transistor ST3 are turned on, the memory cell transistor MT0 and the n+ impurity diffusion region NP are electrically connected to each other by the channel formed near the surface of the p-type well region 320.

Returning to FIG. 2, the description of the structure of the plane PL1 will be continued. As described above, the plane PL1 is provided with the sense amplifier 120 and the row decoder 130 in addition to the above-mentioned memory cell array 110.

The sense amplifier 120 is a circuit for adjusting the voltage applied to the bit line BL and reading the current or voltage of the bit line BL to convert the current or voltage into data. During the reading of the data, the sense amplifier 120 acquires the read data read from the memory cell transistor MT to the bit line BL and transmits the acquired read data to the input/output circuit 21. During the writing of the data, the sense amplifier 120 transmits the write data to the memory cell transistor MT via the bit line BL.

The row decoder 130 is a circuit configured as a switch group (not illustrated) for applying voltages to the respective word lines WL. The row decoder 130 receives a block address and a row address from the register 42, selects the corresponding block BLK based on the block address, and selects the corresponding word line WL based on the row address. The row decoder 130 switches the opening and closing of switches in the above-mentioned switch group so that the voltage from the voltage generation circuit 43 is applied to the selected word line WL.

Figure 6:
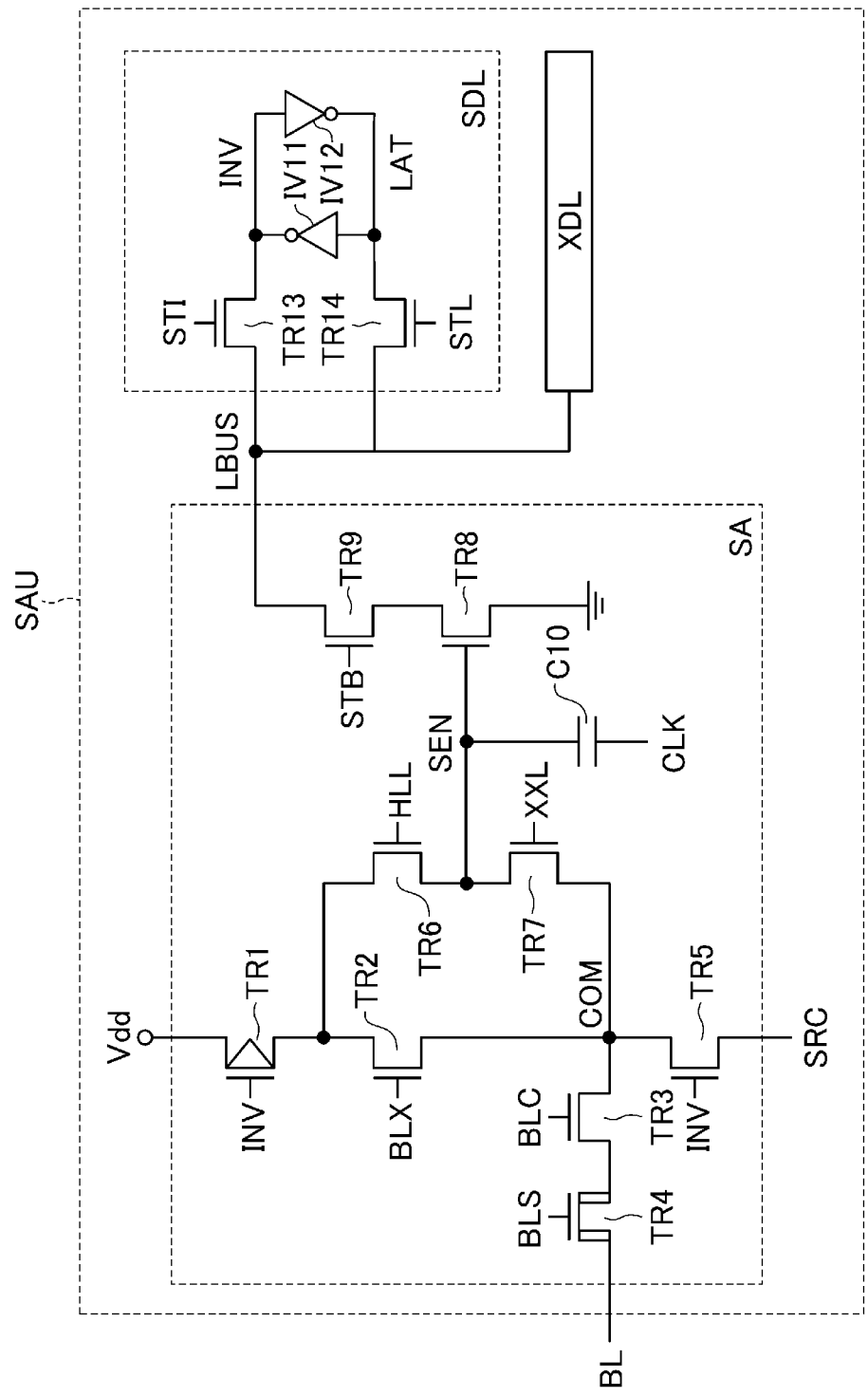
FIG. 6 is a diagram illustrating a circuit configuration of a sense amplifier unit.

FIG. 6 illustrates a configuration example of the sense amplifier 120. The sense amplifier 120 includes a plurality of sense amplifier units SAU associated with each of the plurality of bit lines BL. FIG. 6 illustrates a detailed circuit configuration of one of the sense amplifier units SAU extracted.

As illustrated in FIG. 6, the sense amplifier unit SAU includes a sense amplifier section SA and latch circuits SDL and XDL. The sense amplifier section SA, the latch circuit SDL, and the latch circuit XDL are connected via a bus LBUS so that data can be transmitted and received between each other.

For example, in the read operation, the sense amplifier section SA senses the data read to the corresponding bit line BL and determines whether the read data is "0" or "1". The sense amplifier section SA includes, for example, a transistor TR1 which is a p-channel MOS transistor, transistors TR2 to TR9 which are n-channel MOS transistors, and a capacitor C10.

One end of the transistor TR1 is connected to a power supply line, and the other end of the transistor TR1 is connected to the transistor TR2. The gate of the transistor TR1 is connected to a node INV in the latch circuit SDL. One end of the transistor TR2 is connected to the transistor TR1, and the other end of the transistor TR2 is connected to a node COM. A signal BLX is input to the gate of the transistor TR2. One end of the transistor TR3 is connected to the node COM, and the other end of the transistor TR3 is connected to the transistor TR4. A signal BLC is input to the gate of the transistor TR3. The transistor TR4 is a high breakdown voltage MOS transistor. One end of the transistor TR4 is connected to the transistor TR3. The other end of the transistor TR4 is connected to the corresponding bit line BL. A signal BLS is input to the gate of the transistor TR4.

One end of the transistor TR5 is connected to the node COM, and the other end of the transistor TR5 is connected to a node SRC. The gate of the transistor TR5 is connected to the node INV. One end of the transistor TR6 is connected between the transistor TR1 and the transistor TR2, and the other end of the transistor TR6 is connected to a node SEN. A signal HLL is input to the gate of the transistor TR6. One end of the transistor TR7 is connected to the node SEN, and the other end of the transistor TR7 is connected to the node COM. A signal XXL is input to the gate of the transistor TR7.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. A signal STB is input to the gate of the transistor TR9. One end of the capacitor C10 is connected to the node SEN. A clock CLK is input to the other end of the capacitor C10.

The signals BLX, BLC, BLS, HLL, XXL, and STB are generated, for example, by the sequencer 41. In addition, for example, Vdd which is the internal power supply voltage of the semiconductor storage device 2 is applied to the power supply line connected to one end of the transistor TR1, and for example, Vs s which is the ground voltage of the semiconductor storage device 2 is applied to the node SRC.

The latch circuits SDL and XDL temporarily store the read data. The latch circuit XDL is connected to the input/output circuit 21 and is used for inputting/outputting data between the sense amplifier unit SAU and the input/output circuit 21.

The latch circuit SDL includes, for example, inverters IV11 and IV12 and transistors TR13 and TR14 which are n-channel MOS transistors. An input node of the inverter IV11 is connected to a node LAT. An output node of the inverter IV11 is connected to the node INV. An input node of the inverter IV12 is connected to the node INV. An output node of the inverter IV12 is connected to the node LAT. One end of the transistor TR13 is connected to the node INV, and the other end of the transistor TR13 is connected to the bus LBUS. A signal STI is input to the gate of the transistor TR13. One end of the transistor TR14 is connected to a node LAT, and the other end of the transistor TR14 is connected to the bus LBUS. A signal STL is input to the gate of the transistor TR14. For example, the data stored in the node LAT corresponds to the data stored in the latch circuit SDL. In addition, the data stored in the node INV corresponds to the inverted data of the data stored in the node LAT. Since the circuit configuration of the latch circuit XDL is similar to that of, for example, the latch circuit SDL, the description thereof will be omitted.

As described above, in the semiconductor storage device according to the present embodiment, the memory cell transistor MT includes the ferroelectric film 331, and data is stored in the memory cell transistor MT by the spontaneous polarization of the ferroelectric film 331.

Figure 7:
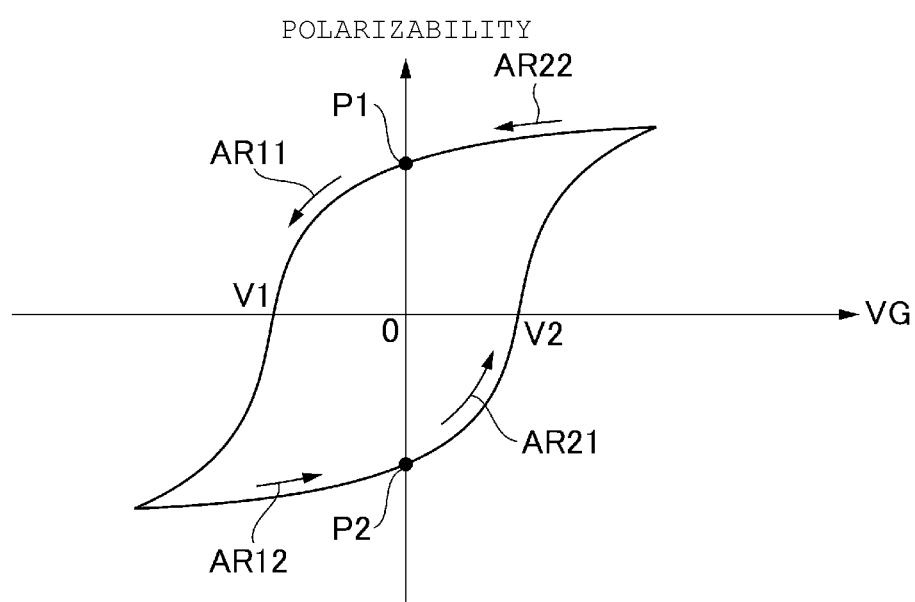
FIG. 7 is a diagram illustrating a relationship between an applied voltage and a polarizability of a memory cell transistor.
Figure 8A:
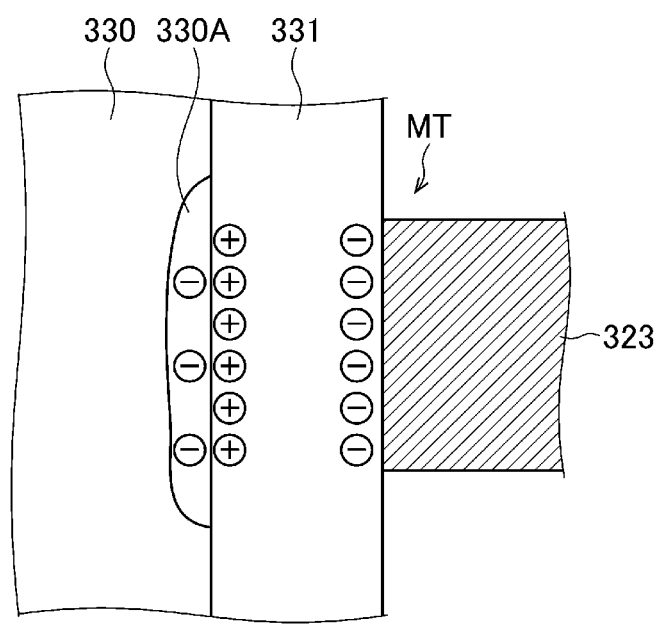
FIGS. 8A and 8B are diagrams schematically illustrating a state of the memory cell transistor.
Figure 8B:
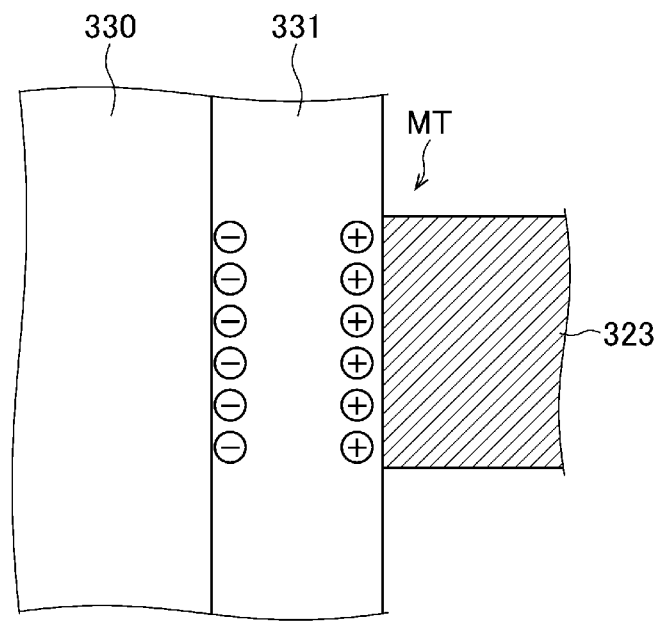

The characteristics of the memory cell transistor MT will be described with reference to FIGS. 7, 8A and 8B. FIG. 7 is a diagram illustrating a relationship between an applied voltage and a polarizability of the memory cell transistor MT. VG illustrated on the horizontal axis of FIG. 7 is a voltage applied between the channel (semiconductor film 330) of the memory cell transistor MT and the word line WL (conductor layer 323). The vertical axis of FIG. 7 represents the polarizability of the ferroelectric film 331. FIG. 8 is a cross-sectional view schematically illustrating a state of the memory cell transistor MT, specifically, a state of the spontaneous polarization of the ferroelectric film 331 and the like.

In the state illustrated in P1 of FIG. 7, the voltage applied to the memory cell transistor MT is 0, and the ferroelectric film 331 is spontaneously polarized in the positive direction. FIG. 8A illustrates the state of the memory cell transistor MT at P1. In this state, positive charges are induced on the surface of the ferroelectric film 331 on the semiconductor film 330 side. The surface of the semiconductor film 330 on the ferroelectric film 331 side is in a state that the channels are connected by the electric field from the ferroelectric film 331 as indicated by a reference numeral "330A". Accordingly, the memory cell transistor MT is turned on.

When the applied voltage is increased to the negative side (that is, when the voltage of the word line WL is decreased) from the state illustrated in P1, the polarizability of the ferroelectric film 331 is changed in the direction of the arrow AR11 along the hysteresis of FIG. 7. When the applied voltage becomes V1, the polarization reversal occurs, and thus, the polarizability of the ferroelectric film 331 is reversed in the negative direction. Next, after passing through the voltage value at which the absolute value of the polarizability becomes the maximum point, when the applied voltage is changed to the positive side (that is, when the voltage of the word line WL is increased), the absolute value of the polarizability of the ferroelectric film 331 is slightly decreased in the direction of an arrow AR12 along the hysteresis of FIG. 7. When the applied voltage becomes 0, the state becomes the state illustrated in P2, and the polarized state of P2 is maintained even when the voltage from the outside is 0.

In the state illustrated in P2, the voltage applied to the memory cell transistor MT becomes 0, and thus, the ferroelectric film 331 is spontaneously polarized in the negative direction. That is, as described above, the polarization reversal occurs from the state illustrated in P1. FIG. 8B illustrates the state of the memory cell transistor MT at P2. In this state, negative charges are induced on the surface of the ferroelectric film 331 on the semiconductor film 330 side. The surface of the semiconductor film 330 on the ferroelectric film 331 side is in a state that the channel is disconnected by the electric field from the ferroelectric film 331. Accordingly, the memory cell transistor MT is turned off.

When the applied voltage is increased to the positive side (that is, when the voltage of the word line WL is further increased) from the state illustrated in P2, the polarizability of the ferroelectric film 331 is changed in the direction of an arrow AR21 along the hysteresis of FIG. 7. When the applied voltage becomes V2, the polarization reversal occurs again, and thus, the polarizability of the ferroelectric film 331 is reversed in the positive direction. Next, after passing through the voltage value at which the absolute value of the polarizability becomes the maximum point, when the applied voltage is changed to the negative side (that is, when the voltage of the word line WL is decreased), the absolute value of the polarizability of the ferroelectric film 331 is slightly decreased in the direction of an arrow AR22 along the hysteresis of FIG. 7. When the applied voltage becomes 0, the state returns to the state illustrated in P1, and the polarized state of P1 is maintained even when the voltage from the outside is 0.

As described above, in the memory cell transistor MT, by changing the applied voltage via the word line WL, it is possible to alternately switch between the state where the ferroelectric film 331 is spontaneously polarized in the positive direction as illustrated in FIG. 8A and the state where the ferroelectric film 331 is spontaneously polarized in the negative direction as illustrated in FIG. 8B.

FIG. 8A illustrates the state where the ferroelectric film 331 is spontaneously polarized in the positive direction. When the applied voltage is changed in the negative direction (that is, the voltage of the word line WL is decreased) from the state of FIG. 8A, the channel is eventually disconnected, and thus, the memory cell transistor MT is turned into off state as illustrated in FIG. 8B. That is, in the state where the ferroelectric film 331 is spontaneously polarized in the positive direction, the threshold voltage of the memory cell transistor MT is a negative value.

FIG. 8B illustrates the state where the ferroelectric film 331 is spontaneously polarized in the negative direction. When the applied voltage is changed in the positive direction (that is, the voltage of the word line WL is increased) from the state of FIG. 8B, the channel is eventually connected, and thus, the memory cell transistor MT is turned into on state as illustrated in FIG. 8A. That is, in the state where the ferroelectric film 331 is spontaneously polarized in the positive direction, the threshold voltage of the memory cell transistor MT is a positive value.

As described above, the memory cell transistor MT in the present embodiment has a configuration in which the direction of spontaneous polarization is changed according to the applied voltage between the word line WL and the channel, and the threshold voltage is also changed accordingly. Specifically, the memory cell transistor MT has a configuration in which, when such a voltage that the voltage of the word line WL is higher than the voltage of the channel beyond the voltage that causes the polarization reversal is applied, the threshold voltage is lowered, and when such a voltage that the voltage of the word line WL is lower than the voltage of the channel beyond the voltage that causes the polarization reversal is applied, the threshold voltage is raised.

Figure 9:
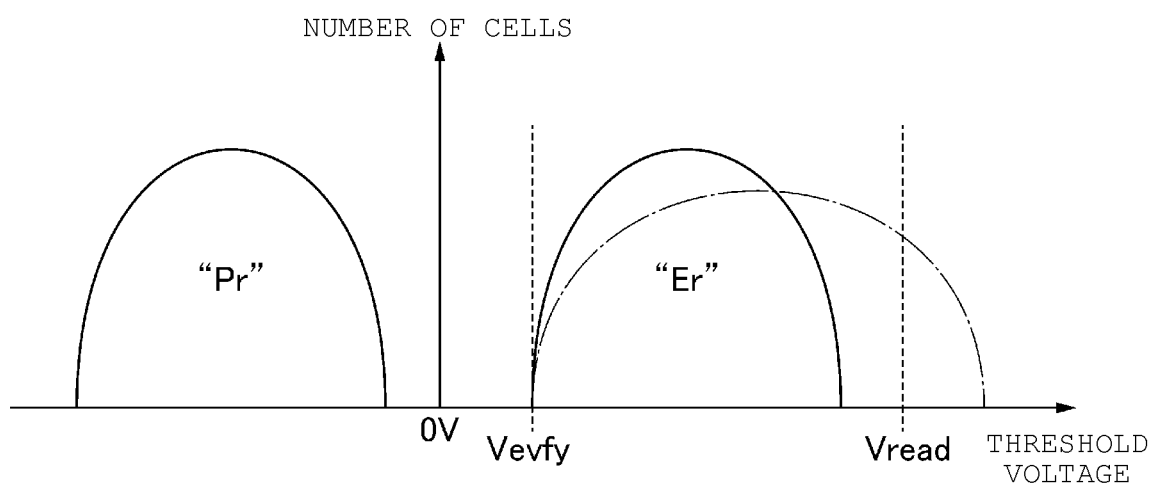
FIG. 9 is a diagram illustrating an example of a threshold voltage distribution of the memory cell transistor.

FIG. 9 is a diagram illustrating the correspondence between the threshold voltage of the memory cell transistors MT (horizontal axis) and the number of memory cell transistors MT (vertical axis). When an SLC method is adopted as in the present embodiment, the plurality of memory cell transistors MT form two threshold voltage distributions as illustrated in FIG. 9. These two threshold voltage distributions (write states) are referred to as a "Pr" state and an "Er" state in order from the lowest threshold voltage.

The "Pr" state is a state of the threshold voltage in a state where the ferroelectric film 331 is spontaneously polarized in the positive direction as illustrated in FIG. 8A. The "Er" state is a state of the threshold voltage in a state where the ferroelectric film 331 is spontaneously polarized in the negative direction as illustrated in FIG. 8B. The "Pr" state is a state in which data has been written and, for example, data of "0" is assigned. The "Er" state is a state in which data has been erased and, for example, data of "1" is assigned.

When the erase operation is performed, the threshold voltage of the memory cell transistor MT is changed from the "Pr" state to the "Er" state. In order to verify whether or not the threshold voltage has changed in this manner, a verify operation is performed after the erase operation.

A verify voltage Vevfy used in the above-mentioned verify operation is set between the "Pr" state and the "Er" state adjacent to each other. The verify voltage Vevfy is set near the lower end of the threshold voltage distribution of the "Er" state.

A read pass voltage Vread is set as a voltage higher than a maximum threshold voltage at the "Er" state. The memory cell transistor MT in which the read pass voltage Vread is applied to the gate is turned on regardless of the stored data.

As described later, during the verify operation, the read pass voltage Vread is applied to the gates of the memory cell transistors MT other than the memory cell transistors MT that are the verify targets among the plurality of memory cell transistors MT in the memory string MS. In addition, the verify voltage Vevfy is applied to the gates of the memory cell transistors MT that are the verify targets. In this state, when no current flows between the bit line BL and the source line SL through the memory string MS, it is verified that the threshold voltage is higher than the verify voltage Vevfy and is at the "Er" state. In this case, it is verified that the data erasing has been performed successfully, and thus the verify operation has "passed".

On the other hand, when a current flows between the bit line BL and the source line SL through the memory string MS, it is verified that the threshold voltage is lower than the verify voltage Vevfy and has not risen to the "Er" state. In this case, it is verified that the data erasing has not been performed successfully, and thus the verify operation has "failed". As described above, when there are a certain number or more of the memory cell transistors MT in which the data erasing is not successful, the erase operation is executed again.

In an FeRAM having a three-dimensional structure, it is common that the data erasing is performed for the plurality of memory cell transistors MT collectively for each unit of a block BLK. In the configuration of the present embodiment, when the data erasing is performed collectively, there is a possibility that, for the memory cell transistor MT in which the data erasing is successful at an early stage, even after that, the erase operation is repeatedly executed. In this case, the threshold voltage of the memory cell transistor MT is increased every time the erase operation is performed.

For this reason, as illustrated by the one-dot dashed line in FIG. 9, there is a possibility that the width of the threshold voltage at the "Er" state becomes wide, and in some memory cell transistors MT, and thus, the threshold voltage becomes larger than the read pass voltage Vread. In such a memory cell transistor MT, even when the read pass voltage Vread is applied to the memory cell transistor MT, the memory cell transistor MT is not turned on. For this reason, when the memory cell transistor MT of which threshold voltage is higher than the read pass voltage Vread exists, the verify operation and the read operation cannot be normally performed. As a countermeasure, it can be considered that the read pass voltage Vread is set to a further higher voltage. However, in this case, there is a concern that data may be erroneously written to the memory cell transistor MT with the application of the read pass voltage Vread.

As described above, in the configuration of the present embodiment including the memory cell transistors MT in which the threshold voltage is raised, when a voltage applied to the word line WL becomes lower than the potential of the channel, there may occur a problem that the distribution of the threshold voltage at the "Er" state is widened with the data erasing performed collectively. Therefore, in the semiconductor storage device 2 according to the present embodiment, the above-mentioned problem is solved by modifying the erase operation and the verify operation.

Figure 10:
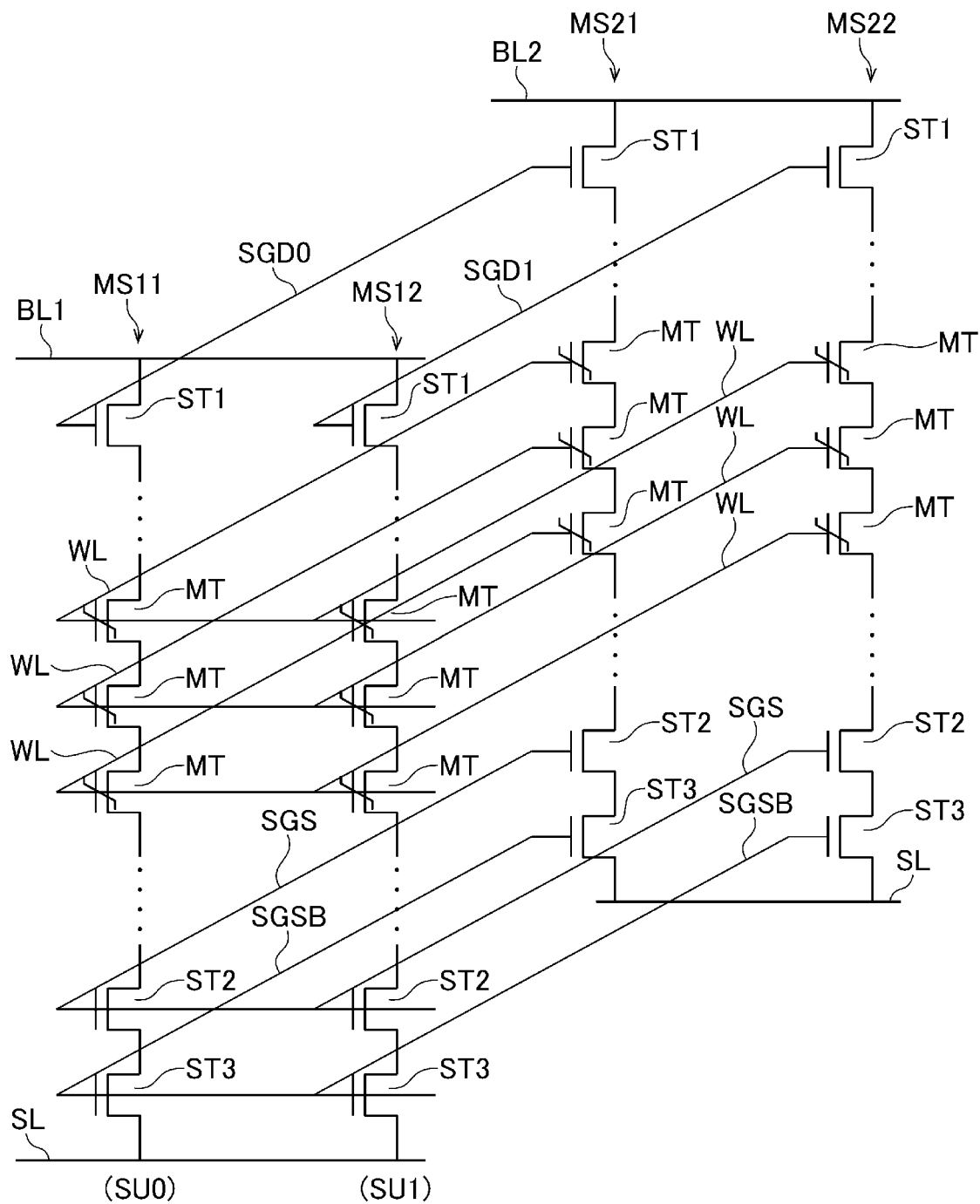
FIG. 10 is an equivalent circuit diagram illustrating a configuration of a portion of the memory cell array.

FIG. 10 illustrates the connection modes of the four memory strings MS extending in the vertical direction as an equivalent circuit diagram similar to that in FIG. 3. Hereinafter, among the plurality of memory strings MS in the memory cell array 110, four memory strings MS11, MS12, MS21, and MS22 illustrated in FIG. 10 are used as examples, and specific aspects of the erase operation and the verify operation executed in the present embodiment will be described.

Among the memory strings, the memory string MS11 and the memory string MS21 belong to the same string unit SU0. In addition, the memory string MS12 and the memory string MS22 belong to the same string unit SU1. The memory string MS11 and the memory string MS12 are connected to the same bit line BL1. In addition, the memory string MS21 and the memory string MS22 are connected to the same bit line BL2.

Figure 11:
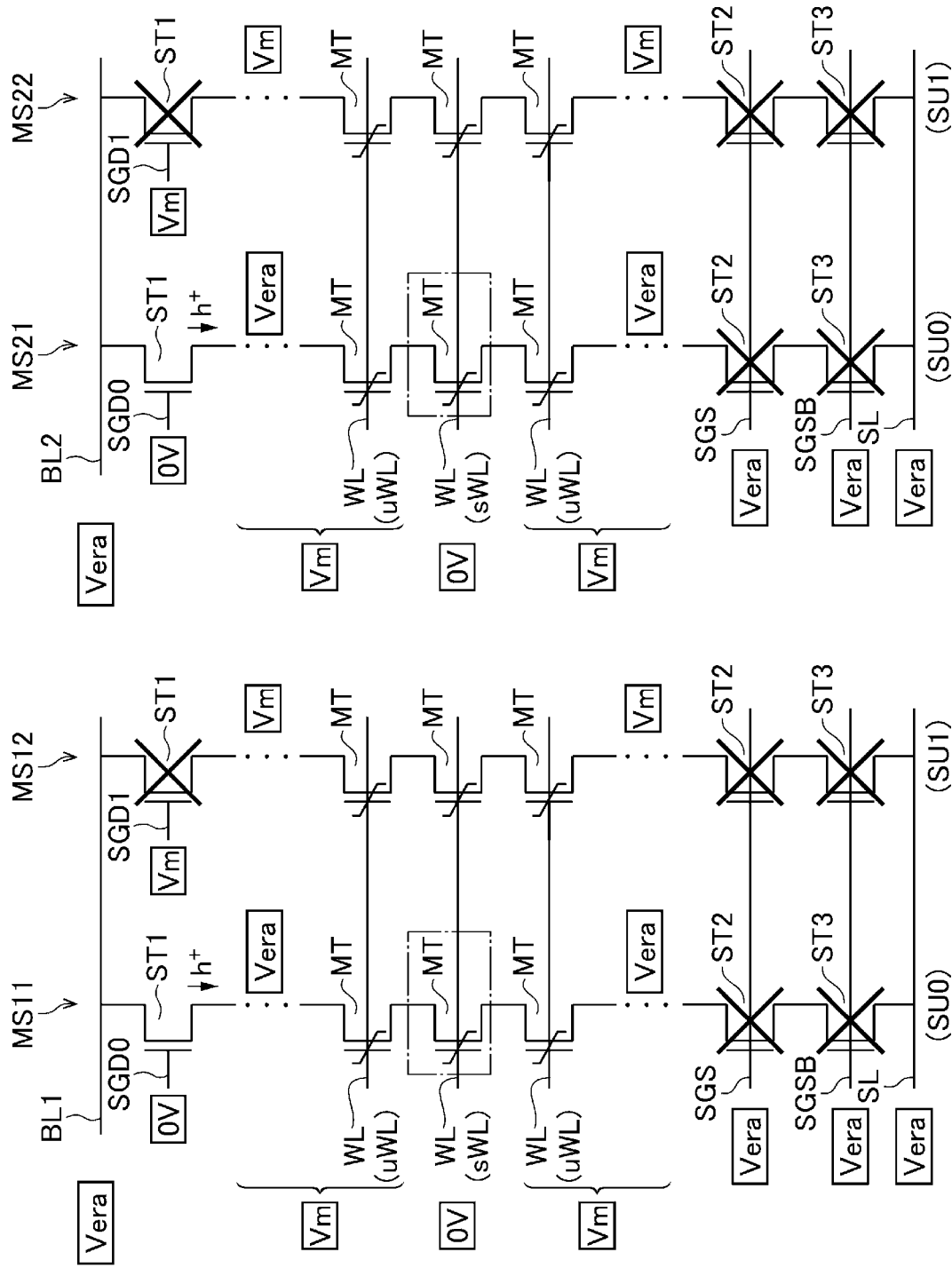
FIG. 11 is a diagram illustrating voltages of the respective portions during an erase operation of the first embodiment.

In order to avoid complication, in FIG. 11, the four memory strings MS11, MS12, MS21, and MS22 are simplified and drawn so as to be arranged on the same plane. The same applies to other figures in the following description.

In the present embodiment, by setting a specific page as the data erase target, the erase operation is selectively performed for only the page. That is, only the plurality of memory cell transistors MT in one cell unit CU as illustrated in FIG. 3 are set as the data erase targets, and the data stored in the other memory cell transistors MT are maintained without being erased.

In FIG. 11, the memory cell transistors MT that are the data erase targets are surrounded by one-dot dashed lines. The word line WL connected to the memory cell transistor MT that is the erase target is also referred to as a "selected word line sWL", hereinafter. The other word lines WL are also referred to as "non-selected word lines uWL", hereinafter. In the example of FIG. 11, among the memory cell transistors MT belonging to the string unit SU0, all of the memory cell transistors MT connected to the selected word line sWL are set as the data erase targets. It is noted that the memory cell transistors MT that are the data erase targets include the memory cell transistors MT of other memory strings MS belonging to the string unit SU0 in addition to the memory cell transistors MT illustrated in FIG. 11.

Character strings such as "Vera" and "Vm" surrounded by rectangular frames in FIG. 11 represent voltages in the respective portions. FIG. 11 illustrates an example of the voltages of the respective portions when the erase operation of the present embodiment is performed. It is noted that the process of adjusting the voltages in the respective portions as illustrated in FIG. 11 is implemented by the operations of the sense amplifier 120, the row decoder 130, the voltage generation circuit 43, and the like based on the control performed by the sequencer 41. The same applies to the verify operation described later.

As illustrated in FIG. 11, when the data erasing is to be executed on a page-by-page basis, the voltages of all the bit lines BL connected to the memory cell transistors MT that are the erase targets are set to Vera. "Vera" is a voltage required to cause the polarization reversal in the memory cell transistor MT to be erased and is, for example, a voltage of about 4 to 8 V. In a first erase operation, the voltages of all the bit lines BL in the block BLK are set to Vera.

In addition, the voltages of the source line SL, the gate line SGS, and the gate line SGSB are also set to Vera similarly to the voltage of the bit line BL. Furthermore, the voltage of the selected word line sWL is set to 0 V (ground voltage Vss), and the voltage of the non-selected word line uWL is set to Vm. "Vm" is a voltage higher than 0 V and lower than Vera, for example, a voltage of ½ of Vera.

The voltage of the gate line SGD0 is set to 0 V. Accordingly, in the first select transistor ST1 connected to the gate line SGD0, holes h+ due to GIDL occur as the voltage difference between the drain and the gate is increased.

At this time, since the voltages of the source line SL, the gate line SGS, and the gate line SGSB become Vera, the holes h+ occurring in the first select transistor ST1 cannot pass through the second select transistor ST2 as described above. For this reason, the voltages of the channels (semiconductor film 330) of the memory strings MS11 and MS21 are raised up to Vera due to the holes h+. That is, in the memory strings MS11 and MS21 including the memory cell transistors MT that are the erase target, the voltages of the respective channels are raised up to Vera.

In addition, the voltage of the gate line SGD1 is set to the same Vm as the voltage of the non-selected word line uWL. In the first select transistor ST1 connected to the gate line SGD1, the voltage difference between the drain and the gate does not become large enough to cause GIDL, so that the holes h+ do not occur.

At this time, the voltages of the channels (semiconductor film 330) of the memory strings MS12 and MS22 including the gate line SGD1 are raised up to Vm for the reason described later. That is, in the memory strings MS12 and MS22 that do not include the memory cell transistors MT that are the erase targets, the voltages of the respective channels are raised up to Vm.

Among the plurality of memory strings MS in the same block BLK, in each one of all the memory strings MS that do not include the memory cell transistors MT that are the erase targets, similarly to the memory strings MS12 and MS22 illustrated in FIG. 11, the voltages of the gate lines connected to the first select transistors ST1 are raised up to Vm.

In the situation where the voltages of the respective portions are adjusted as described above, in the memory cell transistors MT that are the erase targets, the threshold voltage is changed to the "Er" state in FIG. 9 by applying a voltage of −Vera (=0−Vera) between the gate and the channel. As a result, the data stored in the memory cell transistor MT is erased.

In the other memory cell transistors MT in the memory strings MS11 and MS21, the voltage applied between the gate and the channel becomes about Vm−Vera. Since the absolute value of the voltage is smaller than that of −Vera, the threshold voltage of the memory cell transistor MT is not changed. As a result, the data stored in the memory cell transistor MT is not erased.

Among the memory cell transistors MT in the memory strings MS12 and MS22, in the memory cell transistor connected to the selected word line sWL, a voltage of −Vm (=0−Vm) is applied between the gate and the channel. In addition, in the memory cell transistor MT connected to the non-selected word line uWL, a voltage of 0 V (=Vm−Vm) is applied between the gate and the channel. Since the absolute value of any one of the voltages is smaller than that of −Vera, the threshold voltage of the memory cell transistor MT is not changed. As a result, the data stored in the memory cell transistor MT is not erased.

In this manner, when the voltages of the respective portions are adjusted as illustrated in FIG. 11, the data of only the memory cell transistor MT that is the erase target surrounded by the one-dot dashed line is erased, and the data of the other memory cell transistors MT is not erased.

It is noted that, when the data is selectively erased in this manner, the voltage (0 V) of the selected word line sWL is referred to as a "first voltage" in the present embodiment. In addition, among the plurality of memory cell transistors MT connected to the selected word line sWL, the voltage (Vera) of the channel of the memory cell transistor MT that is the erase target is a voltage that is higher than the above-mentioned first voltage and is referred to as the "second voltage" in the present embodiment. Furthermore, among the plurality of memory cell transistors MT connected to the selected word line sWL, the voltage (Vm) of the channel of the memory cell transistor MT that is not the erase target is a voltage that is higher than the first voltage and lower than the second voltage and is referred to as the "third voltage" in the present embodiment.

The semiconductor storage device 2 according to the present embodiment has a configuration where the threshold voltage of a memory cell transistor MT is raised when a voltage applied to the word line WL becomes lower than the voltage of the channel. In addition, the semiconductor storage device 2 has a configuration in which the opening and closing of the second select transistor ST2 or the third select transistor ST3 disposed between each memory string MS and the source line SL cannot be individually switched for each memory string MS.

While adopting such a configuration, the sequencer 41 of the present embodiment can perform the process of erasing the data of a portion of the plurality of memory cell transistors MT connected to the selected word line sWL while leaving the data of the memory cell transistor MT not connected to the selected word line sWL among the plurality of memory cell transistors MT, that is, the selective erasing of the data.

Figure 12:
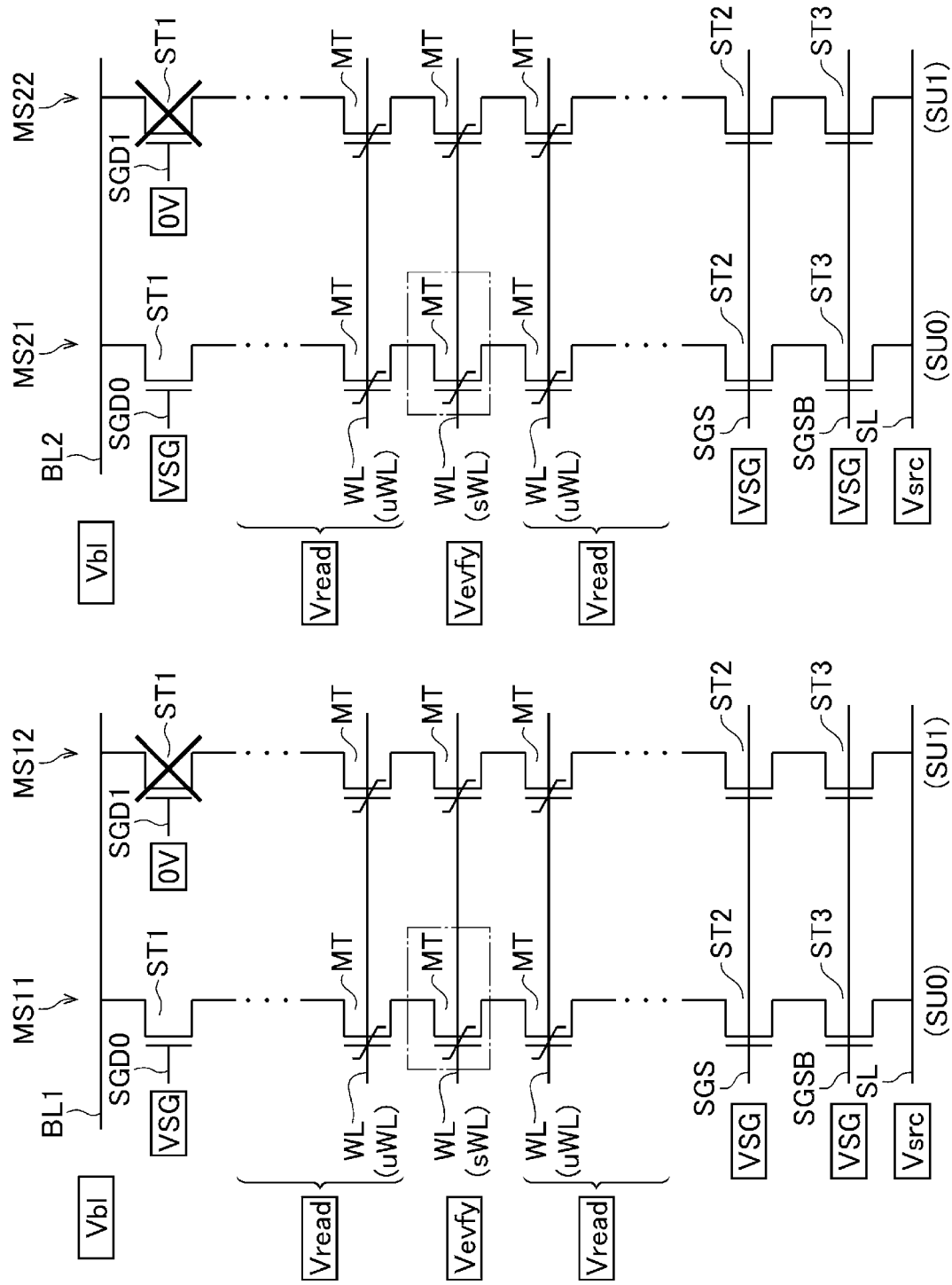
FIG. 12 is a diagram illustrating voltages of the respective portions during a verify operation of the first embodiment.

After the first erase operation for erasing the data of the target page is performed as described above, the verify operation is executed. FIG. 12 illustrates an example of the voltages of the respective portions when the verify operation of the present embodiment is performed.

As illustrated in the figure, in the verify operation, the voltages of all the bit lines BL in the block BLK are set to Vbl. "Vbl" is a voltage required for flowing a current through each memory string MS and is, for example, a voltage of about 1 V.

The voltage of the source line SL is set to Vsrc. "Vsrc" is, for example, the ground voltage (0 V). In addition, each one of the voltages of the gate line SGD0, the gate line SGS, and the gate line SGSB is set to VSG. "VSG" is a voltage required to turn on each of the first select transistor ST1, the second select transistor ST2, and the third select transistor ST3.

On the other hand, the voltage of the gate line SGD1 is set to the ground voltage (0 V). In addition, among the plurality of memory strings MS in the same block BLK, in each one of all the memory strings MS that do not include the memory cell transistors MT that are the erase targets, similarly to the memory strings MS12 and MS22 illustrated in FIG. 12, the voltage of the gate line connected to the first select transistor ST1 is set to 0 V.

The voltage of the non-selected word line uWL is set to Vread. "Vread" is a voltage that turns on the memory cell transistor MT regardless of the data to be stored. The voltage of the selected word line sWL is set to "Vevfy". "Vevfy" is a voltage that turns off the memory cell transistor MT of which threshold voltage is at the "Er" state and turns on the other memory cell transistors MT.

In the situation where the voltages of the respective portions are adjusted as described above, the verify voltage Vevfy is applied between the gate and the source in each of the memory cell transistors MT that are the erase targets. For this reason, when the threshold voltage in the memory cell transistor MT is at the "Er" state, that is, when the data erasing in the memory cell transistor MT is successful, the memory cell transistor MT is turned off. On the other hand, when the threshold voltage in the memory cell transistor MT is not at the "Er" state, that is, when the data erasing in the memory cell transistor MT is not successful, the memory cell transistor MT is turned on.

In the other memory cell transistors MT in the memory strings MS11 and MS21, the read pass voltage Vread is applied between the gate and the source. Accordingly, each one of these memory cell transistors MT is turned on.

When the data erasing in the memory cell transistor MT is successful, the memory cell transistor MT is turned off as described above. For this reason, in the memory string MS including such memory cell transistor MT, no current flows between the bit line BL and the source line SL. On the other hand, when the data erasing in the memory cell transistor MT is not successful, the memory cell transistor MT is turned on as described above. For this reason, in the memory string MS including such memory cell transistor MT, since all the memory cell transistors MT are turned on, a current flows between the bit line BL and the source line SL.

Each of the memory cell transistors MT that are the erase targets is connected to one of the bit lines BL. The sequencer 41, which is a control circuit, detects the current flowing through each bit line BL via the sense amplifiers 120 and 220. The sequencer 41 can determine whether or not the data erasing in each memory cell transistor MT has been successful based on the magnitude of the current flowing through each bit line BL.

The sequencer 41 executes a second erase operation after performing the verify operation as described above. The second erase operation is performed by setting only the memory cell transistor MT as the target, which is determined by the verify operation that the data erasing has not been successful. That is, for the memory cell transistor MT which is determined that the data erasing has been successful in the previous erase operation, the erase operation is not executed again.

Figure 13:
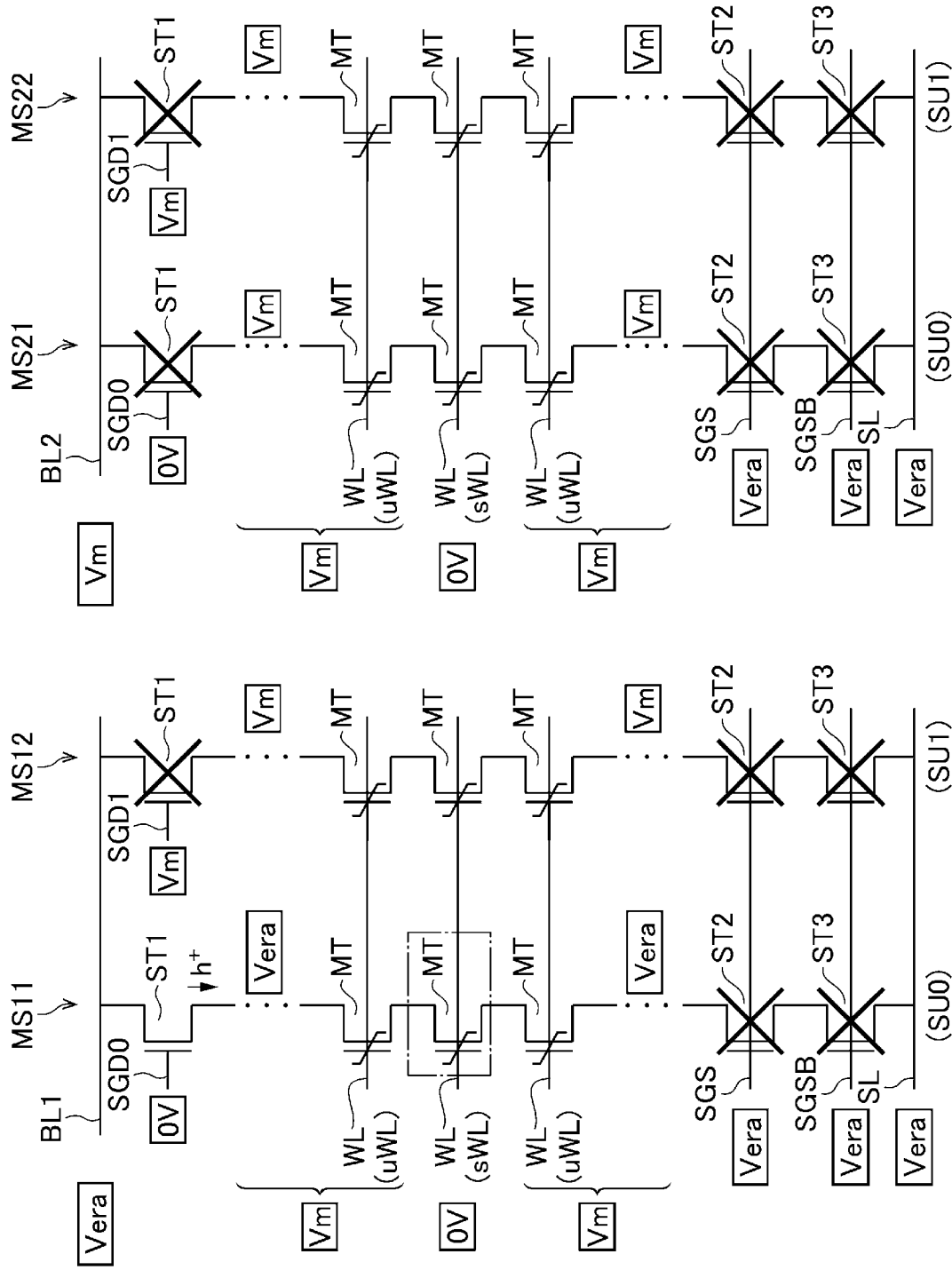
FIG. 13 is a diagram illustrating voltages of the respective portions during the erase operation of the first embodiment.

FIG. 13 illustrates an example of the voltages of the respective portions when the second erase operation is performed. The example of FIG. 13 is an example where, among the plurality of memory cell transistors MT that are the erase targets in the first erase operation, the data erasing is successful for the memory cell transistors MT in the memory string MS21, and the data erasing is not successful for the memory cell transistors MT in the memory string MS11. For this reason, in the example of FIG. 13, the memory cell transistors MT in the memory string MS11 become the erase targets, and the memory cell transistors MT in the memory string MS21 are excluded from the erase targets.

In the memory string MS11 including the memory cell transistors MT that are the erase targets, the voltage of the bit line BL1 connected to the memory string MS11 is set to Vera similarly to the first erase operation. In addition, among the plurality of memory strings MS in the same block BLK, in all the memory strings MS including the memory cell transistors MT (that is, the memory cell transistors MT that have failed the verify operation) that are the erase targets at this time, similarly to the memory string MS11 of FIG. 13, the voltage of the bit line BL connected to each memory string is set to Vera.

On the other hand, in the memory string MS21 that does not include the memory cell transistor MT that is the erase target, the voltage of the bit line BL2 connected to the memory string is set to Vm. In addition, among the plurality of memory strings MS in the same block BLK, in all the memory strings MS (that is, the memory string MS including the memory cell transistor MT that has passed the verify operation) that do not include the memory cell transistors MT that are the erase targets, similarly to the memory string MS21 of FIG. 13, the voltage of the bit line BL connected to each memory string is set to Vm.

In the memory string MS21 in which the voltage of the bit line BL2 is set to Vm, 0 V is applied to the gate of the first select transistor ST1, and Vm is applied to the drain. In addition, in the memory strings MS22 connected to the same bit line BL2, Vm is applied to the gate of the first select transistor ST1, and Vm is also applied to the drain. In this state, in each one of the memory strings MS21 and MS22, the voltage difference between the drain and the gate of the first select transistor ST1 does not become large enough to cause GIDL, so that the holes h+ do not occur.

As a result, in the memory strings MS21 and MS22, the voltage of each channel is raised up to Vm. That is, the memory strings are in the same state as the memory string MS22 in the example of FIG. 11. For this reason, in the memory strings MS21 and MS22, the data stored in the memory cell transistor MT is not erased.

In this manner, the memory strings MS including the memory cell transistors MT that has passed the verify operation are excluded from the erase targets by setting the voltage of the bit line BL connected to the memory strings MS to Vm at the time of the next erase operation.

When the erase operation and the verify operation are repeated by such a method, the sequential erase operation is prevented from being executed for the memory cell transistor MT in which the data erasing is successful. For this reason, as described with reference to FIG. 9, it is possible to reliably prevent a phenomenon in which some threshold voltage becomes larger than the read pass voltage Vread.

Figure 14:
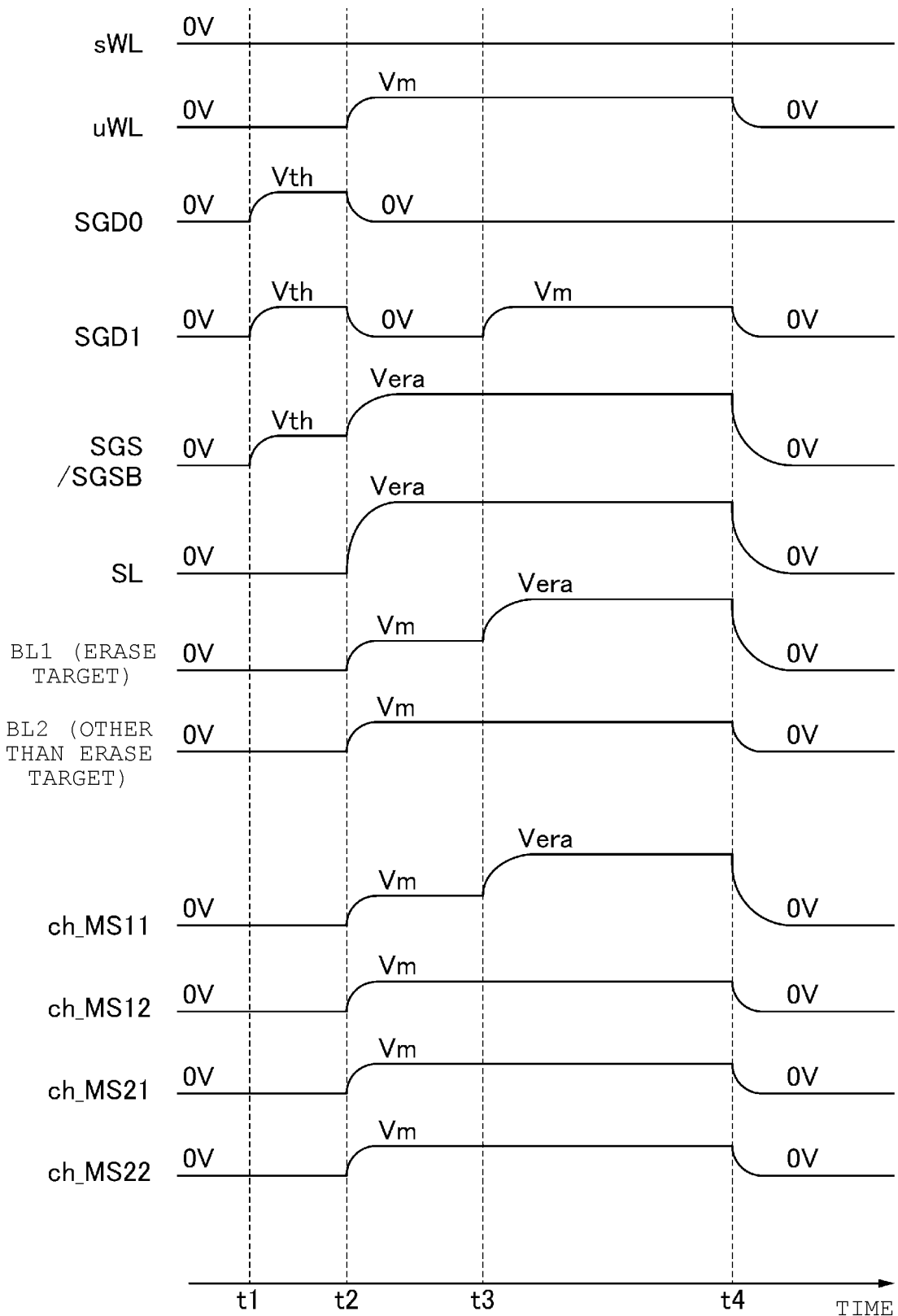
FIG. 14 is a time chart illustrating voltage changes of the respective portions during the erase operation of the first embodiment.

FIG. 14 illustrates an example of a time chart for setting the voltages of the respective portions to the state illustrated in FIG. 13. "sWL" in FIG. 14 is an example of a time change of the voltage of the selected word line sWL, and "uWL" is an example of a time change of the voltage of the non-selected word line uWL. "SGD0" is an example of a time change of the voltage of the gate line SGD0, and "SGD1" is an example of a time change of the voltage of the gate line SGD1. "SGS" is an example of a time change of the voltage of the gate line SGS, and "SGSB" is an example of a time change of the voltage of the gate line SGSB. "SL" is an example of a time change of the voltage of the source line SL, "BL1" is an example of a time change of the voltage of the bit line BL1, and "BL2" is an example of a time change of the voltage of the bit line BL2.

"ch_MS11" in FIG. 14 is an example of a time change of the voltage in the channel (semiconductor film 330) of the memory string MS11. Similarly, "ch_MS12" is an example of a time change of the voltage in the channel of the memory string MS12, "ch_MS21" is an example of a time change of the voltage in the channel of the memory string MS21, and "ch_MS22" is an example of a time change of the voltage in the channel of the memory string MS22.

In a period before the time t1 when the erase operation is started, the sequencer 41 sets the voltages of each bit line BL, each word line WL, and source line SL to 0 V. At the time t1, the sequencer 41 switches the voltages of the gate line SGD0, the gate line SGD1, the gate line SGS, and the gate line SGSB to Vth. "Vth" is a voltage for switching each transistor to the ON state. Accordingly, in all the memory strings MS in the block BLK, each of the first select transistor ST1, the second select transistor ST2, and the third select transistor ST3 is turned on. In addition, each one of the voltages of the respective channels in the memory strings MS11, MS12, MS21, and MS22 is 0 V.

At the subsequent time t2, the sequencer 41 switches the voltages of the gate line SGD0 and the gate line SGD1 to 0 V and switches the voltages of the gate line SGS, the gate line SGSB, and the source line SL to Vera. Furthermore, the sequencer 41 switches the voltage of each bit line BL to Vm.

After the time t2, each of the first select transistor ST1, the second select transistor ST2, and the third select transistor ST3 is turned off. For this reason, each one of the channels of the respective memory strings MS is in a floating state.

In this state, the sequencer 41 raises the voltage of the non-selected word line uWL up to Vm. Along with this, the voltage of the channel of each memory string MS is raised up to Vm by capacitive coupling. On the other hand, the voltage of the selected word line sWL is maintained at 0 V even after the time t2. In this manner, the sequencer 41 raises the voltages of the channels up to Vm by setting the channels (ch_MS12, ch_MS21, and ch_MS22) of the memory cell transistors MT that are not the erase target among the plurality of memory cell transistors MT connected to the selected word line sWL to be in a floating state and by raising the voltages of the word lines WL (specifically, the non-selected word lines uWL) other than the selected word line sWL up to a predetermined fourth voltage. As the above-mentioned "fourth voltage", Vm is used in the present embodiment.

At the subsequent time t3, in the memory string MS that does not include the memory cell transistor MT that is the erase target, the sequencer 41 raises the voltage of the gate line SGD connected to the gate of the first select transistor ST1 up to Vm. Accordingly, the voltage of the gate line SGD1 is raised up to Vm.

At the same time, the sequencer 41 raises the voltage of the bit line BL, which is connected to the memory string MS including the memory cell transistors MT that are the erase targets, up to Vera. Accordingly, the voltage of the bit line BL1 is raised up to Vera.

In the memory string MS including the memory cell transistors MT that are the erase targets, as described above, the holes h+ occur in the first select transistor ST1. For this reason, the voltage of the channel (ch_MS11 in the example of FIG. 14) in the memory string MS is raised up to Vera after the time t3.

On the other hand, in the memory string MS that does not include the memory cell transistors MT that are the erase targets, as described above, the holes h+ do not occur in the first select transistor ST1. For this reason, the voltages of the channels (ch_MS12, ch_MS21, and ch_MS22 in the example of FIG. 14) in the memory string MS are maintained to be Vm even after the time t3.

By performing the processes described above, the voltages of the respective portions when the erase operation is performed have a distribution as illustrated in FIG. 13. This state is maintained until the time t4 when the erase operation is ended. At the time t4, each one of the voltages of the respective portions such as the selected word line sWL is set to 0 V.

It is noted that, when the first erase operation is performed, the voltage distribution as illustrated in FIG. 11 can be obtained by changing the voltage of the bit line BL2 to be similar to the voltage of the bit line BL1.

Figure 15:
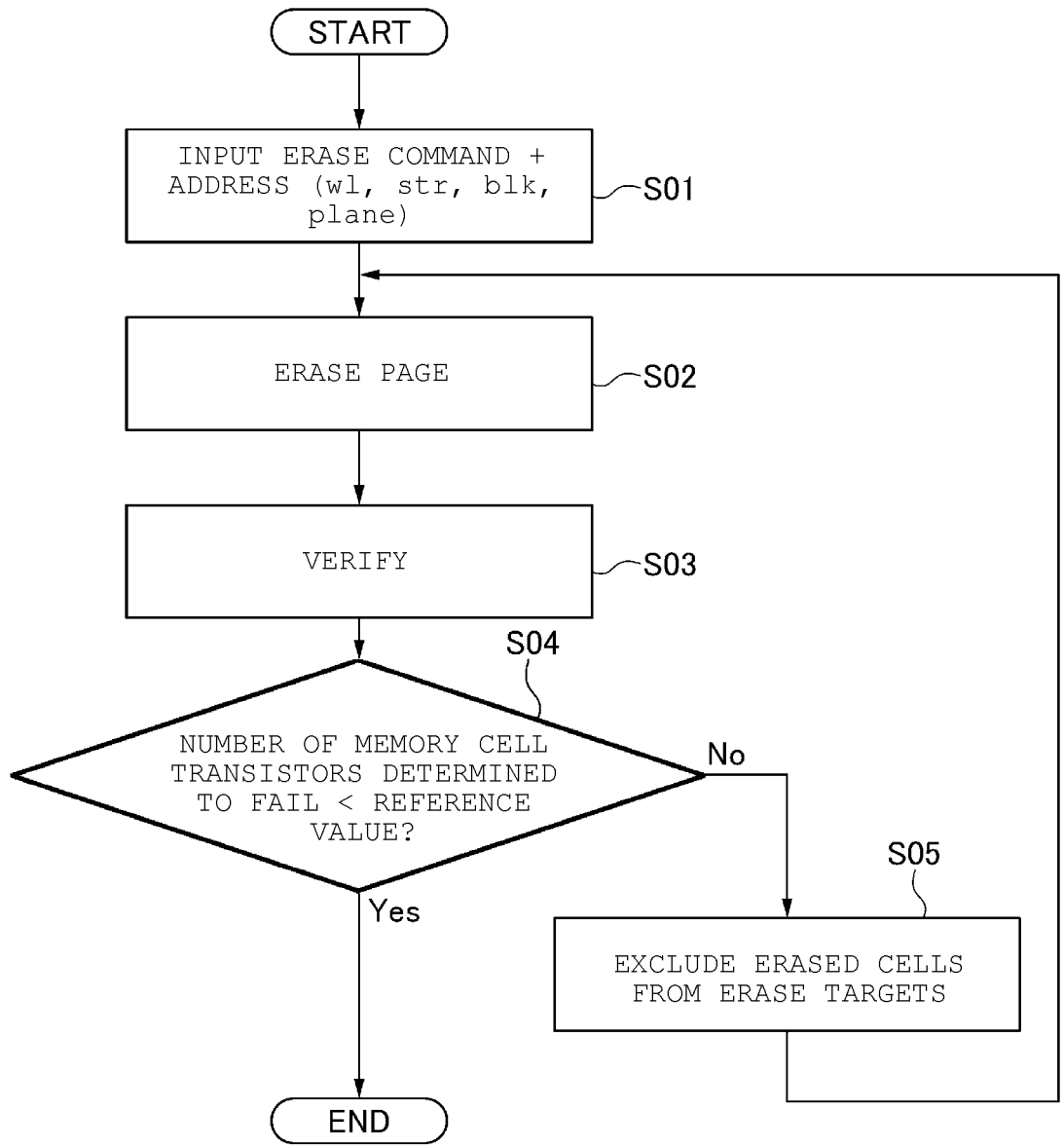
FIG. 15 is a flowchart illustrating a flow of processes executed by a sequencer of the first embodiment.

The flow of processes executed for the selective erasing will be described with reference to FIG. 15. A series of the processes illustrated in FIG. 15 is executed by the sequencer 41, which is a control circuit, each time an erase command is input from the memory controller 1.

In S01, which is the first step of the process, the erase command from the memory controller 1 is input to the interface circuit 20 of the semiconductor storage device 2. The erase command is a command for erasing a specific page in the semiconductor storage device 2. An address for specifying the erase target together with the erase command is also input to the interface circuit 20. The address includes various signals configured with wl, str, blk, and plane. The signal "wl" is a signal for specifying the selected word line sWL. The signal "str" is a signal for specifying the memory string MS that is the target. The signal "blk" is a signal for specifying the block BLK that is the target. The signal "plane" is a signal for specifying the plane (PL1, PL2) that is the target. A group of memory cell transistors MT designated by the address is also referred to as a "group of erase targets", hereinafter.

In S02, which is a step subsequent to S01, the erase operation is executed by setting the page designated in S01 as the erase target. When the erase operation of S02 is to be first executed, the erase operation is executed by setting all the memory cell transistors MT belonging to the group of erase targets as the targets by the method similar to the method described with reference to FIG. 11. Specifically, after setting the voltages of all the bit lines BL in the block BLK to Vera, the erase operation is executed.

In S03, which is a step subsequent to S02, the verify operation is executed for the page designated in S01. Herein, it is determined whether or not the threshold voltage of each memory cell transistor MT belonging to the group of erase targets is larger than the verify voltage Vevfy by the method similar to the method described with reference to FIG. 12.

In S04, which is a step subsequent to S03, it is determined whether or not the number of memory cell transistors MT determined to have failed the verify operation of S03, that is, the number of memory cell transistors MT determined to have a threshold voltage smaller than the verify voltage Vevfy is smaller than a predetermined reference value. The "reference value" is a preset value as an upper limit value of the number of memory cell transistors MT so that a problem does not occur in the operation of the semiconductor storage device 2 even when the erase operation is not successful. When the number of memory cell transistors MT determined to have failed the verify operation of S03 falls below the reference value, a series of the processes illustrated in FIG. 15 are ended. In this case, a series of the processes for erasing the page in accordance with the command of S01 are ended.

When the number of memory cell transistors MT determined to have failed the verify operation of S03 is equal to or greater than the reference value, the process proceeds to S05. In S05, a process of excluding the memory cell transistor MT determined to have passed the verify operation of S03, from the erase targets in the next erase operation is performed. After that, the processes subsequent to S02 are executed again.

When the erase operation of S02 is to be executed again, in the memory string MS including the memory cell transistors MT excluded from the erase targets, similarly to the memory string MS21 in the example of FIG. 13, the voltage of the bit line BL connected to the memory string MS is set to Vm instead of Vera. For this reason, a large voltage such as −Vera is not applied between the gate and the channel of the memory cell transistor MT excluded from the erase targets. A large voltage such as −Vera is applied only between the gate and the channel of the memory cell transistor MT that is a subsequent erase target.

The erase operation of S02 and the verify operation of S03 are repeatedly executed until the number of memory cell transistors MT determined to have failed the verify operation falls below the reference value.

As described above, the sequencer 41 which is a control circuit repeats the erase operation for erasing the data of the memory cell transistor MT belonging to the group of erase targets among the plurality of memory cell transistors MT connected to the selected word line sWL and the verify operation for verifying the result of the erase operation. Among the memory cell transistors MT belonging to the group of erase targets, the memory cell transistor determined to have been erased in the verify operation are excluded from the data erase targets in the next erase operation. Accordingly, in some memory cell transistors MT, it is possible to prevent a phenomenon in which the threshold voltage after the erasing becomes larger than the read pass voltage Vread.

In the present embodiment, the selective erasing is performed by setting the page designated in S01 as the target. That is, among the plurality of memory cell transistors MT connected to the selected word line sWL, only the memory cell transistors belonging to a single string unit SU are set to as the above-mentioned group of erase targets.

When performing the selective erasing, the sequencer 41 which is a control circuit sets the voltage of the selected word line sWL to 0 V (first voltage), sets the voltage of the channel of the memory cell transistor MT that is the erase target among the plurality of memory cell transistors MT connected to the selected word line sWL to Vera (second voltage) that is higher than the first voltage, and sets the voltage of the channel of the memory cell transistor MT that is not the erase target among the plurality of memory cell transistors MT connected to the selected word line sWL to Vm (third voltage) that is higher than the first voltage and lower than the second voltage. By adjusting the voltages of the respective portions in this manner, it is possible to perform the erase operation by setting only the cells that are the erase targets as the targets.

A second embodiment will be described. Hereinafter, the points different from the first embodiment will be mainly described, and the points common to the first embodiment will be omitted as appropriate.

Figure 16:
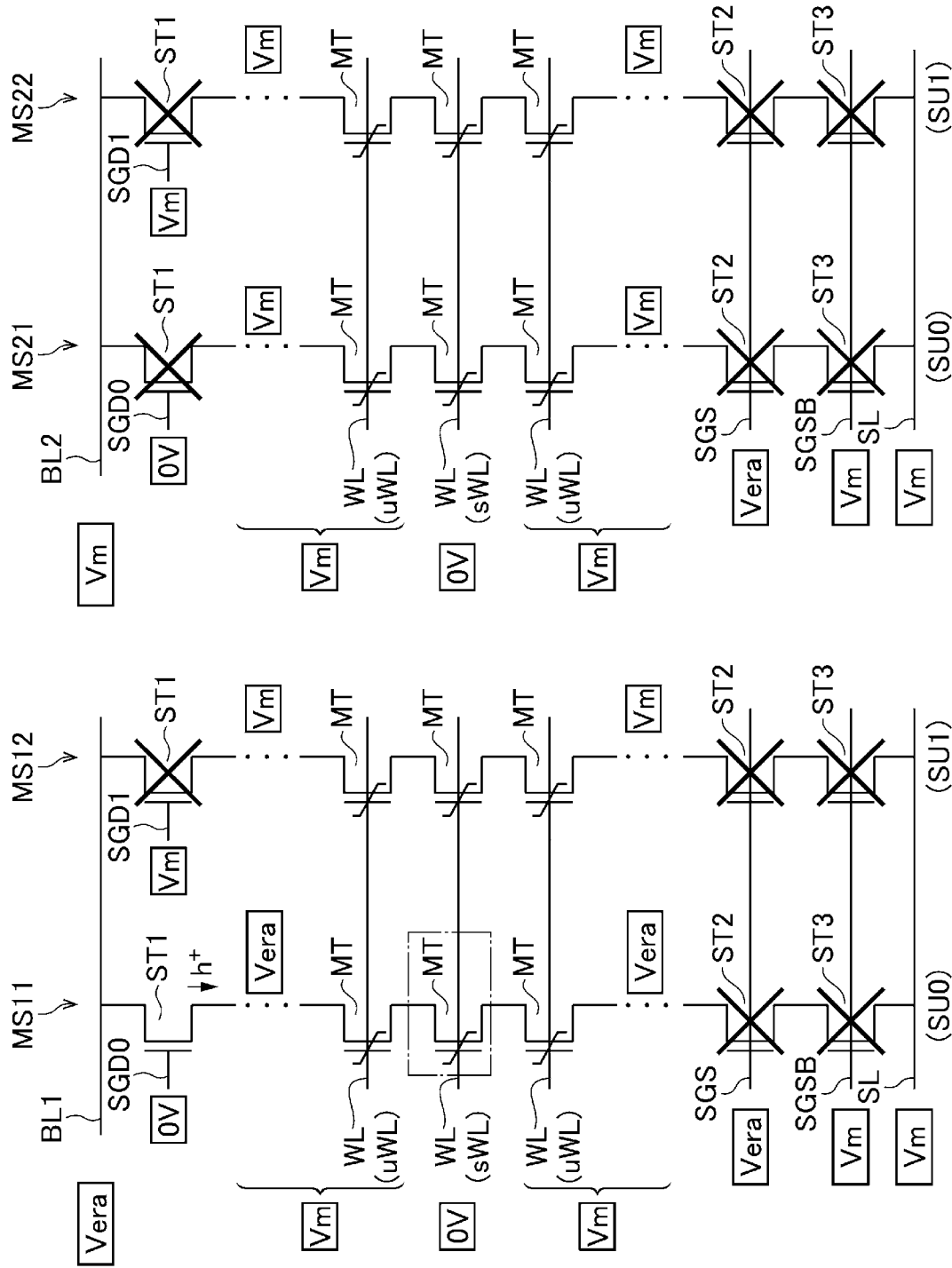
FIG. 16 is a diagram illustrating voltages of the respective portions during an erase operation of a second embodiment.

FIG. 16 illustrates the voltages of the respective portions when the erase operation is performed in the semiconductor storage device 2 according to the present embodiment by the method similar to that in FIG. 13. As is clear from the comparison between FIGS. 16 and 13, in the present embodiment, Vm instead of Vera is applied to the gate line SGSB during the erase operation, and Vm instead of Vera is also applied to the source line SL. It is noted that, although FIG. 16 illustrates the state during the second and subsequent erase operations similar to that in FIG. 13, Vm is applied to the gate line SGSB, and Vm is also applied to the source line SL even during the first erase operation similar to that described above.

Figure 17:
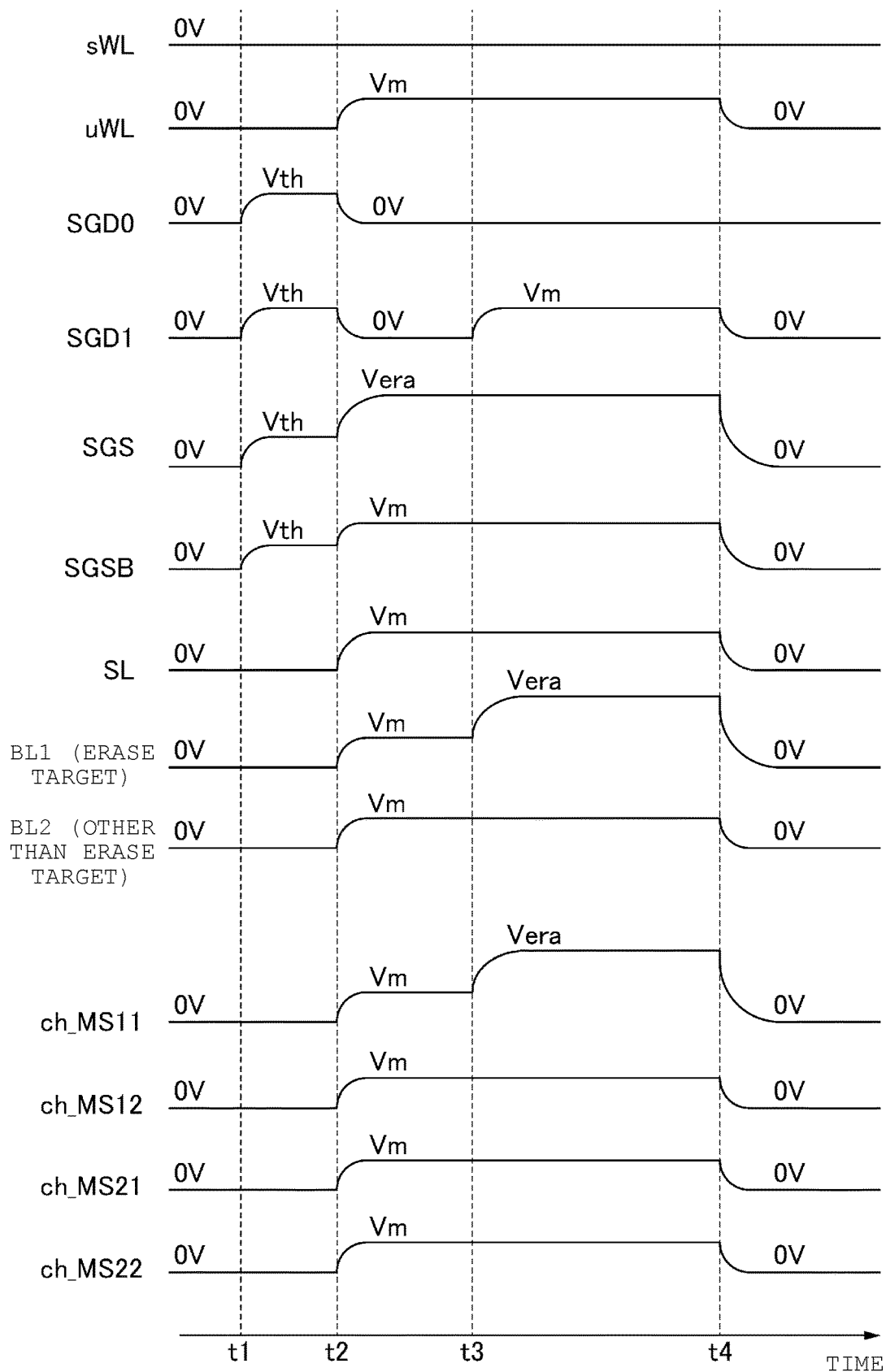
FIG. 17 is a time chart illustrating voltage changes of the respective portions during the erase operation of the second embodiment.

FIG. 17 illustrates a time chart for obtaining such a voltage distribution by the method similar to that in FIG. 14. As is clear from the comparison between FIGS. 17 and 14, in the present embodiment, at the time t2, the voltage of the gate line SGSB is raised from Vth to Vm, and the voltage of the source line SL is also raised from Vth to Vm. Others are the same as those of the first embodiment (FIG. 14).

The advantage of having the voltage distribution as illustrated in FIG. 16 during the erase operation will be described. As described above, during the erase operation, the voltages of the channels of the memory strings MS12, MS21, and MS22 which are not the erase targets are raised up to Vm.

At this time, when electrons as carriers exist in the channel, the electrons can pass through the second select transistor ST2 and move to the source line SL side. When Vera is applied to both the gate line SGSB and the source line SL similarly to the first embodiment, the movement of the electrons is not hindered by the third select transistor ST3. For this reason, there is a possibility that the electrons of the channel of the memory string MS12 and the like may escape to the source line SL, and thus, the voltage of the channel may be raised up to near Vera. As a result, there is a possibility that, in the memory cell transistor MT connected to the selected word line sWL, the data may be erroneously erased even though the memory cell transistor MT is not the erase target.

In contrast, in the present embodiment, Vm is applied to both the gate line SGSB and the source line SL. For this reason, even when there are electrons that pass through the second select transistor ST2, the movement of the electrons to the source line SL is hindered by the third select transistor ST3. In this case, since the voltage of the memory string MS12 or the like, which is not the erase target, is maintained at Vm, the above-mentioned erroneous erasing is prevented.

As described above, during the performing of the selective erasing, the sequencer 41 of the present embodiment sets the voltage of the gate line SGS to Vera (second voltage) and sets the voltage of the gate line SGSB to Vm (third voltage). Accordingly, it is possible to prevent the data of the memory cell transistor MT that is not the erase target from being erroneously erased.

A third embodiment will be described. Hereinafter, the points different from the first embodiment will be mainly described, and the points common to the first embodiment will be omitted as appropriate.

Figure 18:
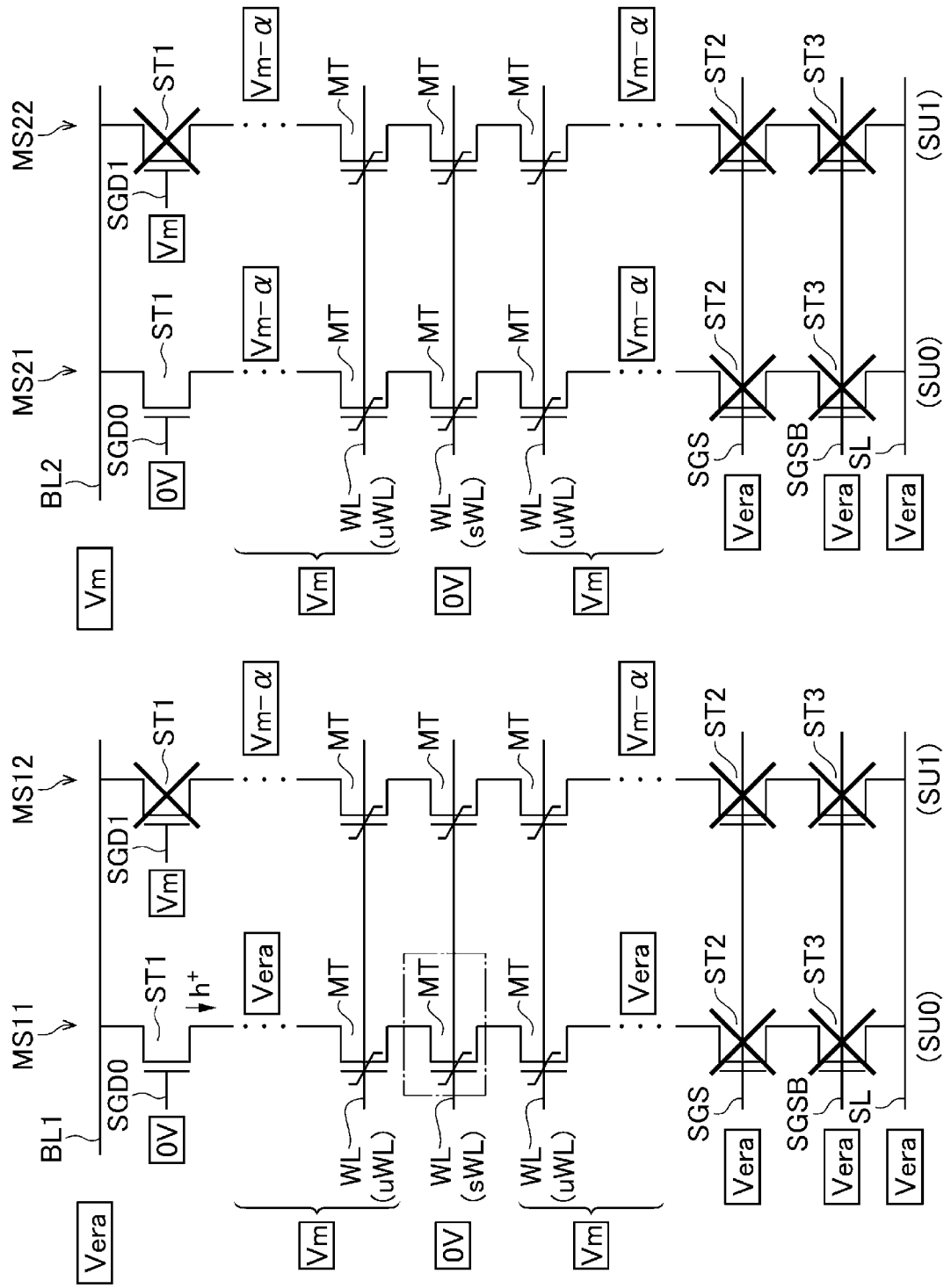
FIG. 18 is a diagram illustrating voltages of the respective portions during an erase operation of a third embodiment.

FIG. 18 illustrates the voltages of the respective portions when the erase operation is performed in the semiconductor storage device 2 according to the present embodiment by the method similar to that in FIG. 13. As is clear from the comparison between FIGS. 18 and 13, in the present embodiment, the voltages of the channels of the memory strings MS12, MS21, and MS22 which are not the erase targets are "Vm−α" which is lower than Vm.

Figure 19:
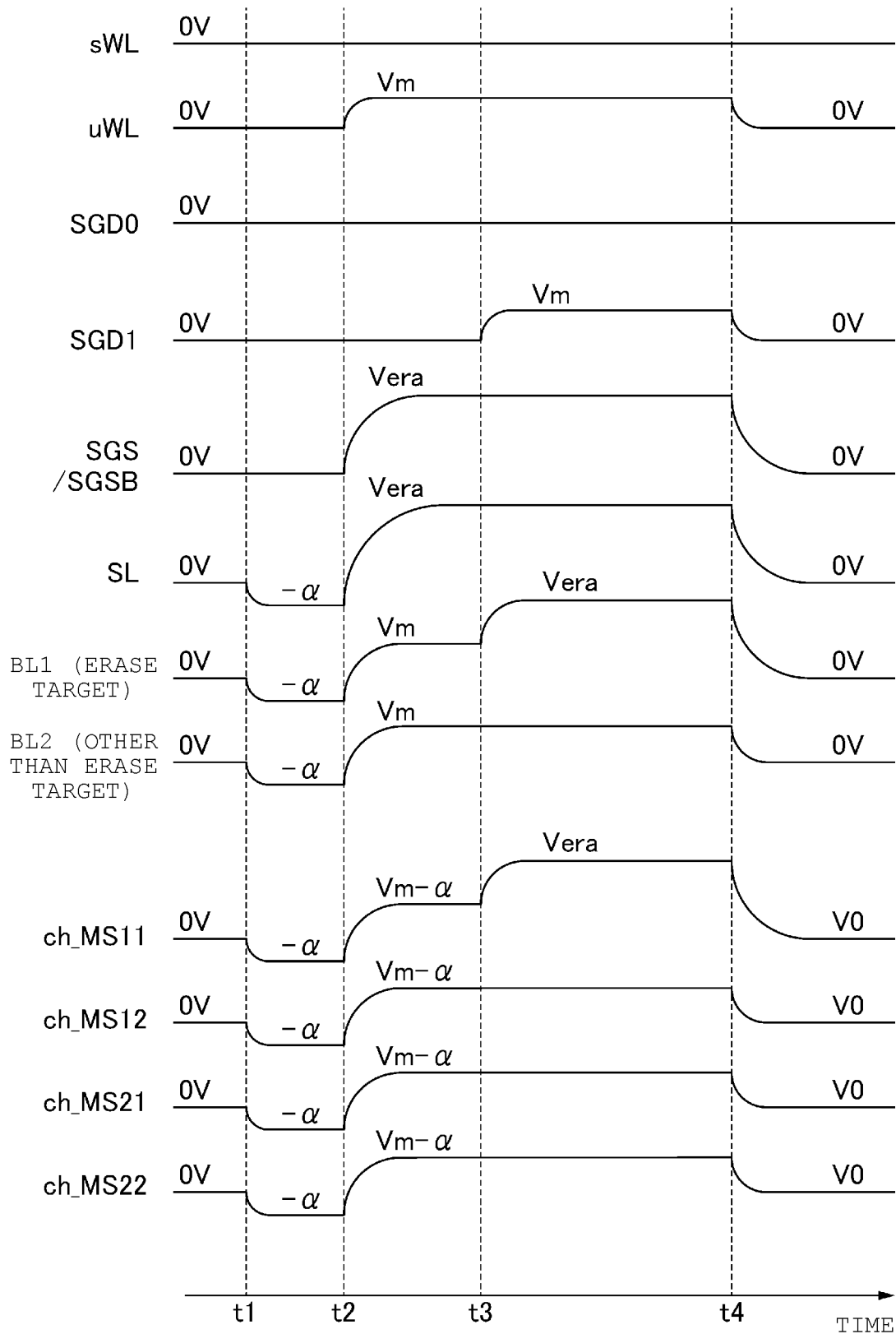
FIG. 19 is a time chart illustrating voltage changes of the respective portions during the erase operation of the third embodiment.

FIG. 19 illustrates a time chart for obtaining such a voltage distribution by the method similar to that in FIG. 14. As illustrated in FIG. 19, in the present embodiment, at the time t1, the sequencer 41 which is a control circuit lowers the voltages of the source line SL and all the bit lines BL down to "−α" which is lower than the ground voltage. At this time, each one of the voltages of the gate lines SGD0, SGD1, SGS, and SGSB is maintained to be 0 V. However, the first select transistor ST1 and the second select transistor ST2 are turned on without hindering the movement of electrons as the voltage of the bit line BL or the like is lowered down to −α as described above. For this reason, the voltage of the channel of each memory string MS together with the voltages of the bit line BL and the source line SL is also lowered down to −α.

At the time t2, the sequencer 41 raises the voltage of the non-selected word line uWL up to Vm similarly to the first embodiment. The voltage of the channel of each memory string MS is raised by Vm due to capacitive coupling. However, in the present embodiment, since the voltages of the respective channels have been lowered down to −α in advance, the voltages at the time t3 do not become Vm but are raised up to only Vm−α.

After that, the sequencer 41 raises the voltage of the bit line BL up to Vera at the time t4. Accordingly, the voltage distribution illustrated in FIG. 18 is implemented.

In the voltage distribution of the first embodiment illustrated in FIG. 13, among the memory strings MS11 including the memory cell transistors MT that are the erase targets, a voltage of Vm−Vera is applied between the gate and the channel of the memory cell transistor MT connected to the non-selected word line uWL.

When the selective erasing is repeated on a page-by-page basis by the method illustrated in FIG. 13, the number of times of applying the voltage of Vm−Vera as to the respective memory cell transistors MT described above becomes very large. When the memory cell transistor MT has a characteristic that is weak against erasing disturb (that is, a characteristic that its threshold voltage is easy to be raised), it is preferable to lower "Vm−Vera" by setting Vm to a higher voltage. However, when Vm is set to a high voltage, the Vm, which is the voltage of the channel (ch_MS12 or the like) of the memory string MS12 or the like that does not include the memory cell transistor MT that is the erase target, also becomes high. For this reason, there is a possibility that, among the memory cell transistors MT connected to the selected word line sWL, the data of the memory cell transistors MT that do not belong to the group of erase targets may also be erroneously erased.

Therefore, in the present embodiment, the voltage distribution as illustrated in FIG. 18 is implemented in the erase operation. In the voltage distribution, the voltage of the channel (ch_MS12 or the like) of the memory string MS12 or the like that does not include the memory cell transistor MT that is the erase target is raised up to only Vm−α instead of Vm as described above. For this reason, by setting Vm to a higher voltage, even when "Vm−Vera" is reduced, the voltage of the channel (ch_MS12 or the like) in the memory string MS12 or the like does not become too high. As a result, among the memory cell transistors MT connected to the selected word line sWL, the data of the memory cell transistor MT that does not belong to the group of erase targets is prevented from being erroneously erased.

It is noted that, in the memory cell transistor MT connected to the non-selected word line uWL among the memory strings MS12 and the like, the voltage applied between the gate and the channel is raised from 0 V (=Vm−Vm) of the first embodiment to α (=Vm−(Vm−α)) in the present embodiment. For this reason, when α becomes too large, there is a possibility that the threshold voltage of some memory cell transistors MT may be lowered to reach the "Pr" state in FIG. 9. That is, there is a possibility that the data writing is erroneously performed.

In order to prevent the erroneous data writing, it is preferable that α is allowed to have a size such that the data writing is not erroneously performed. It is preferable to adopt the erase operation using the voltage distribution as in the present embodiment when the memory cell transistor has a characteristic that is weak against erasing disturb and strong against writing disturb (that is, a characteristic that its threshold voltage is difficult to be lowered).

The sequencer 41 of the present embodiment raises the voltage of the channel up to Vm−α by setting the channels (ch_MS12, ch_MS21, and ch_MS22) of the memory cell transistors MT that are not the erase targets among the plurality of memory cell transistors MT connected to the selected word line sWL to be in a floating state and by raising the voltages of the word lines WL (specifically, the non-selected word lines uWL) other than the word line sWL up to Vm. "Vm−α" corresponds to the "third voltage" in the present embodiment. In addition, "Vm" corresponds to the "fourth voltage" in the present embodiment.

At this time, the sequencer 41 lowers the voltage of each of the channels (ch_MS12, ch_MS21, and ch_MS22) of the memory cell transistors MT that are not the erase targets by a predetermined voltage (−α) in advance and, after that, executes the selective erasing after the time t2. For this reason, in the present embodiment, the fourth voltage (Vm) becomes a voltage higher than the third voltage (Vm−α). By the above-described method, the voltage distribution as illustrated in FIG. 18 can be easily implemented.

It is noted that, in the third embodiment as well, similarly to the second embodiment, the erase operation may be performed while setting each of the gate line SGSB and the source line SL to the third voltage (Vm−α).

A fourth embodiment will be described. Hereinafter, the points different from the first embodiment will be mainly described, and the points common to the first embodiment will be omitted as appropriate.

Figure 20:
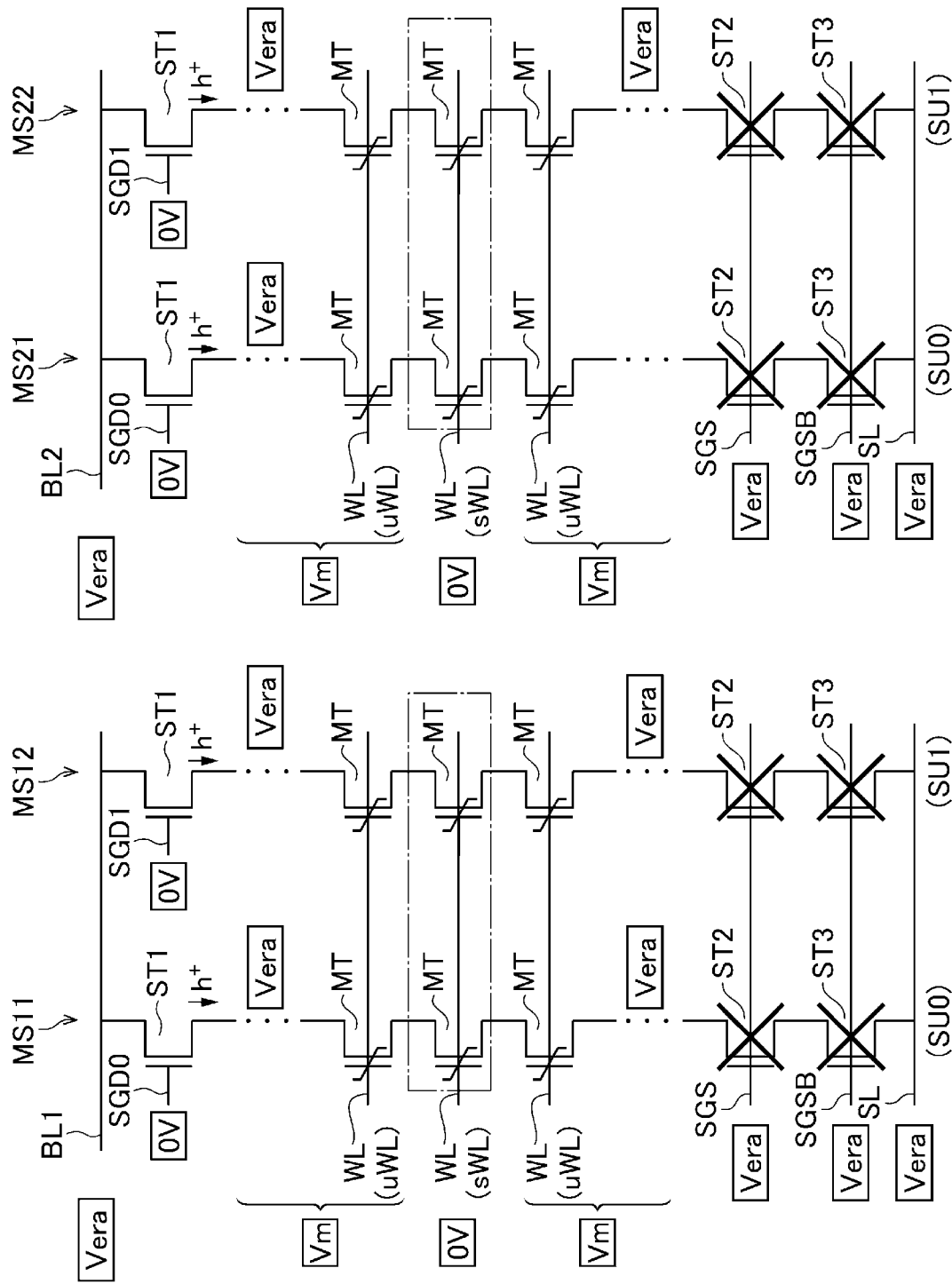
FIG. 20 is a diagram illustrating voltages of the respective portions during an erase operation of a fourth embodiment.

FIG. 20 illustrates the voltages of the respective portions when the first erase operation is performed in the semiconductor storage device 2 according to the present embodiment by the method similar to that in FIG. 13. In the present embodiment, the data erasing is performed not on a page-by-page basis but on a layer-by-layer basis. That is, all of the plurality of memory cell transistors MT connected to the selected word line sWL are set as the data erase targets. In other words, after setting all of the plurality of memory cell transistors MT connected to the selected word line sWL as the group of erase targets, the erase operation is performed.

In FIG. 20, the memory cell transistors MT that are the data erase targets are surrounded by one-dot dashed lines. In the first erase operation, the data erase targets are all the memory cell transistors MT in the group of erase targets, that is, all the memory cell transistors MT connected to the selected word line sWL.

As illustrated in FIG. 20, even when the data erasing as in the present embodiment is executed on a layer-by-layer basis, the voltages of all the bit lines BL connected to the memory cell transistor MT that is the erase target are set to Vera. In the first erase operation, the voltages of all the bit lines BL in the block BLK are set to Vera.

In addition, similarly to the voltage of the bit line BL, the voltages of the source line SL, the gate line SGS, and the gate line SGSB are also set to Vera. Furthermore, the voltage of the selected word line sWL is set to 0 V (ground voltage Vss), and the voltage of the non-selected word line uWL is set to Vm.

Each one of the voltages of the gate lines SGD0 and SGD1 is set to 0 V. Accordingly, in all the memory strings MS in the block BLK, in the first select transistor ST1, the holes h+ due to GIDL occur as the voltage difference between the drain and the gate is increased.

At this time, since the voltages of the source line SL, the gate line SGS, and the gate line SGSB become Vera, the holes h+ occurring in the first select transistor ST1 cannot pass through the second select transistor ST2 as described above. For this reason, the voltages of the channels (semiconductor film 330) of all the memory string MS are raised up to Vera due to the holes h+.

In the situation where the voltages of the respective portions are adjusted as described above, in the memory cell transistor MT that is the erase target, that is, the memory cell transistor MT connected to the selected word line sWL, the threshold voltage is changed to the "Er" state in FIG. 9 by applying a voltage of −Vera (=0−Vera) between the gate and the channel. That is, the data stored in the memory cell transistor MT is erased.

In the other memory cell transistors MT, that is, the memory cell transistors MT connected to the non-selected word lines uWL, the voltage applied between the gate and the channel becomes about Vm− Vera. Since the absolute value of the voltage is smaller than that of −Vera, the threshold voltage of the memory cell transistor MT is not changed. That is, the data stored in the memory cell transistor MT is not erased.

In this manner, when the voltages of the respective portions are adjusted as illustrated in FIG. 20, the data of only the memory cell transistor MT that is the erase target surrounded by the one-dot dashed line is erased, and the data of the other memory cell transistors MT is not erased.

Figure 21:
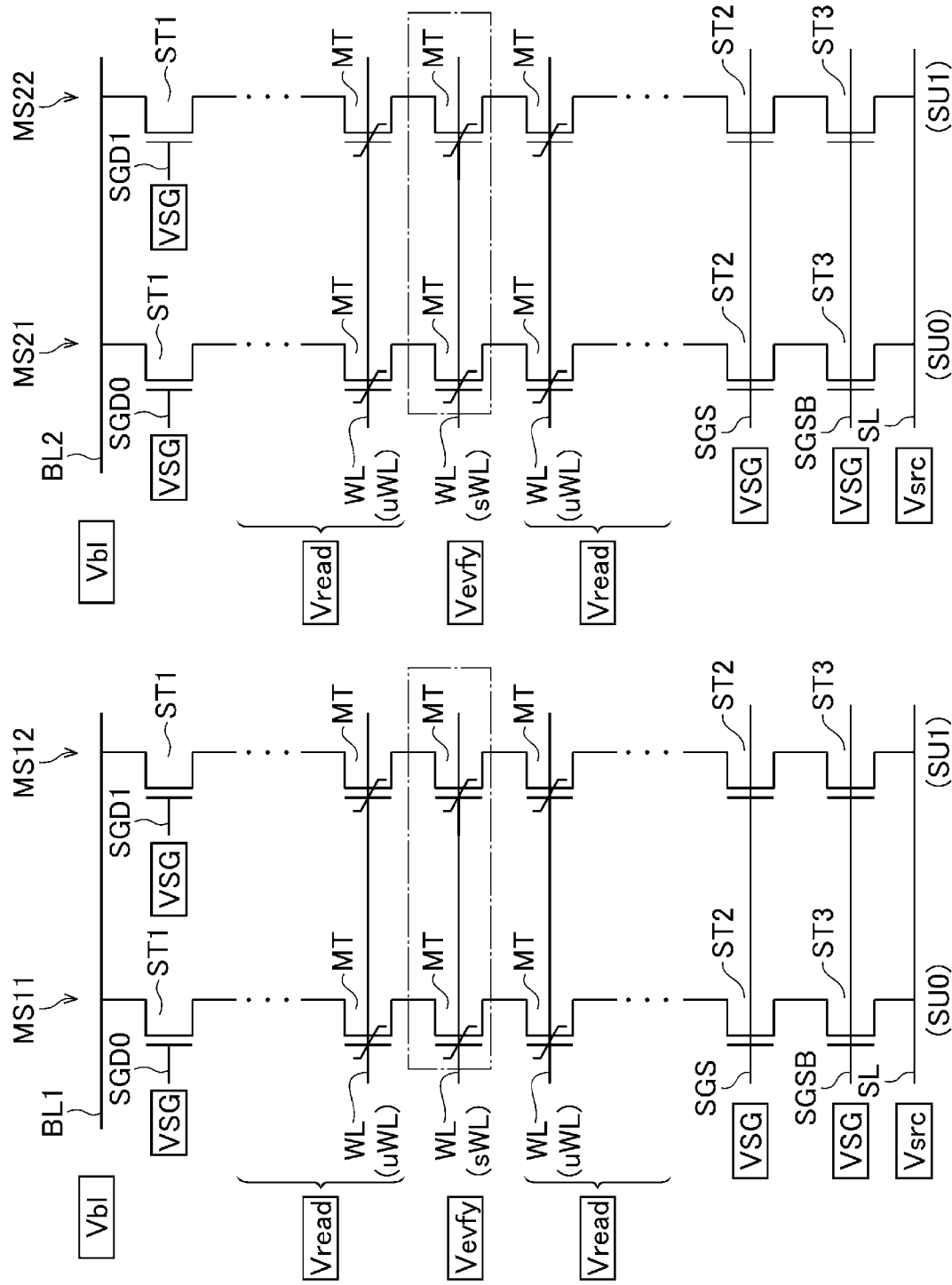
FIG. 21 is a diagram illustrating voltages of the respective portions during a verify operation of the fourth embodiment.

After the first erase operation for erasing the data of the target layer is performed as described above, the verify operation is executed. FIG. 21 illustrates an example of the voltages of the respective portions when the verify operation of the present embodiment is performed.

As illustrated in the figure, similarly to the first embodiment, in the verify operation of the present embodiment as well, the voltages of all the bit lines BL in the block BLK are set to Vbl. The voltage of the source line SL is set to Vsrc. Each one of the voltages of the gate line SGD0, the gate line SGS, and the gate line SGSB is set to VSG.

In the present embodiment, similarly to the gate line SGD0, the voltage of the gate line SGD1 is also set to VSG. In the plurality of memory strings MS provided in the block BLK, similarly to each memory string MS illustrated in FIG. 21, the voltage of the gate of the first select transistor ST1 is set to VSG.

In the present embodiment as well, the voltage of the non-selected word line uWL is set to Vread, and the voltage of the selected word line sWL is set to "Vevfy".

In the situation where the voltages of the respective portions are adjusted as described above, in each of the memory cell transistors MT that are the erase targets, the verify voltage Vevfy is applied between the gate and the source. For this reason, when the threshold voltage in the memory cell transistor MT is at the "Er" state, that is, when the data erasing in the memory cell transistor MT is successful, the memory cell transistor MT is turned off. On the other hand, when the threshold voltage in the memory cell transistor MT is not at the "Er" state, that is, when the data erasing in the memory cell transistor MT is not successful, the memory cell transistor MT is turned on.

In the other memory cell transistors MT in each memory string MS, the read pass voltage Vread is applied between the gate and the source. Accordingly, each one of the memory cell transistors MT is turned on.

When the data erasing in the memory cell transistor MT is successful, the memory cell transistor MT is turned off as described above. For this reason, in the memory string MS including the memory cell transistor MT, no current flows between the bit line BL and the source line SL. On the other hand, when the data erasing in the memory cell transistor MT is not successful, the memory cell transistor MT is turned on as described above. For this reason, in the memory string MS including the memory cell transistor MT, since all the memory cell transistors MT are turned on, a current flows between the bit line BL and the source line SL.

Each of the memory cell transistors MT that are the erase targets is connected to one of the bit lines BL. The sequencer 41, which is a control circuit, detects the current flowing through each bit line BL via the sense amplifiers 120 and 220. The sequencer 41 can determine whether or not the data erasing in each memory cell transistor MT has been successful based on the magnitude of the current flowing through each bit line BL.

For example, in the example of FIG. 21, when a current flows through the bit line BL2, the sequencer 41 can determine that the data erasing is not successful in one of the memory strings MS21, MS22, and the like connected to the bit line BL2. In addition, for example, when no current flows through the bit line BL1, the sequencer 41 can determine that the data erasing is successful in all of the memory strings MS11 and the like connected to the bit line BL1.

However, for example, when a current flows through the bit line BL2, the sequencer 41 cannot determine which of the memory strings MS connected to the bit line BL2 has failed verification. The bit line BL through which a current flows in the verify operation, that is, the bit line BL in which the data erasing is not successful in one of the memory cell transistors MT connected to the bit line BL is also referred to as a "fail" bit line, hereinafter. In addition, the bit line BL through which no current flows in the verify operation, that is, the bit line BL in which the data erasing is successful for all of the memory cell transistors MT connected to the bit line BL is also referred to as a "pass" bit line, hereinafter.

The sequencer 41 executes the second erase operation after performing the verify operation as described above. The second erase operation is performed by setting only the memory cell transistor MT, which is determined by the verify operation that the data erasing is not successful, as the target. Specifically, the second erase operation is performed by setting only the memory cell transistor MT connected to the "fail" bit line as the target. The memory cell transistors MT connected to the "pass" bit line are excluded from the targets of the second erase operation.

Figure 22:
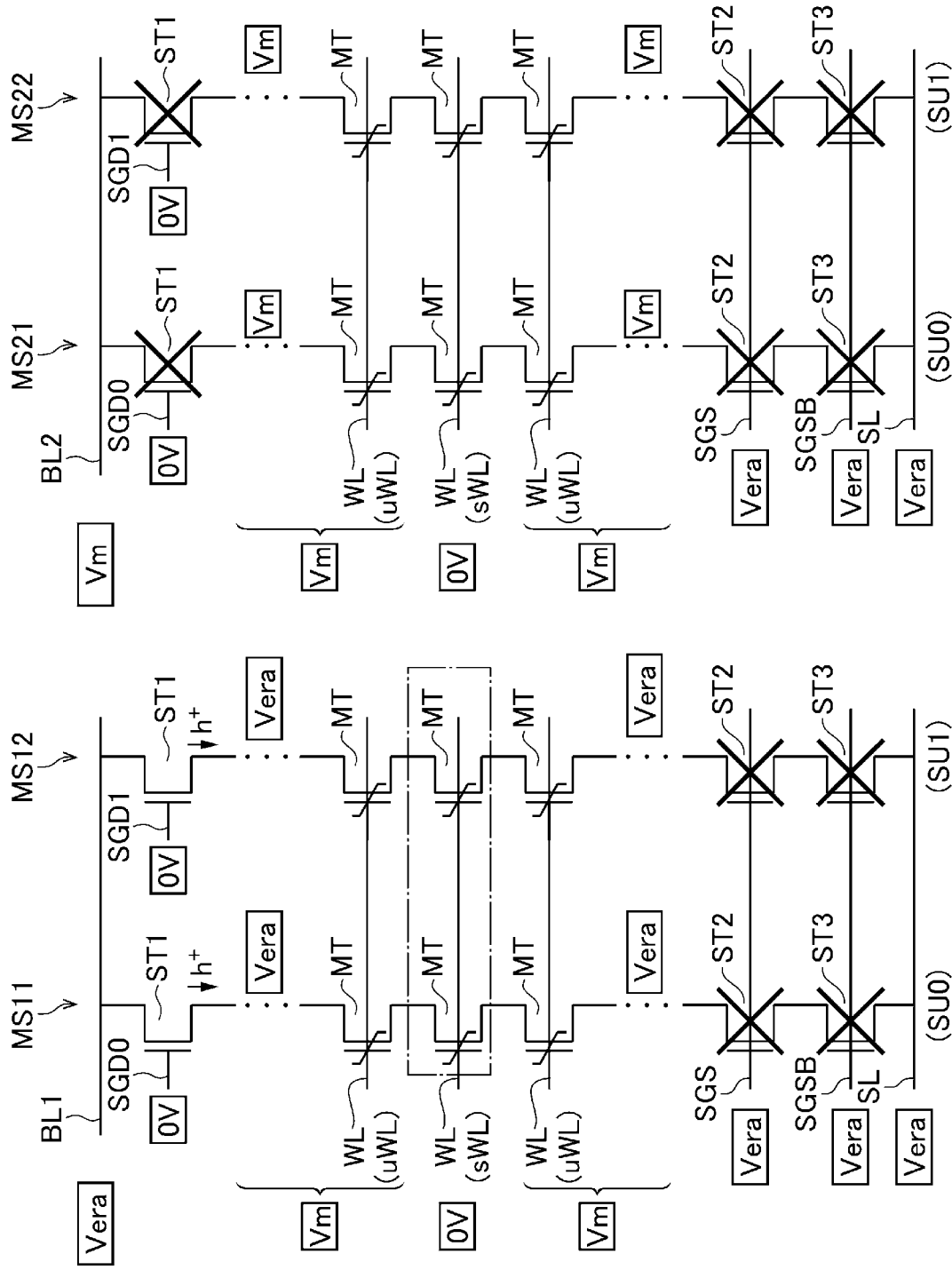
FIG. 22 is a diagram illustrating voltages of the respective portions during the erase operation of the fourth embodiment.

FIG. 22 illustrates an example of the voltages of the respective portions when the second erase operation is performed. The example of FIG. 22 is an example in which the bit line BL1 is determined to be the "fail" bit line and the bit line BL2 is determined to be the "pass" bit line in the verify operation performed subsequently to the first erase operation. For this reason, in the example of FIG. 22, the memory cell transistor MT connected to the bit line BL1 becomes the erase target, and the memory cell transistor MT connected to the bit line BL2 is excluded from the erase targets.

In the memory strings MS11 and MS12 connected to the bit line BL1 which is a "fail" bit line, similarly to the first erase operation, the voltage of the bit line BL1 connected to the memory strings is set to Vera. In addition, among the plurality of memory strings MS in the same block BLK, for all the memory strings MS connected to the other bit lines BL determined to be the "fail" bit lines, similarly to the memory strings MS11 and MS12 of FIG. 22, the voltage of the bit line BL connected to each of the memory strings is set to Vera.

In the memory strings MS21 and MS22 connected to the bit line BL2 which is a "pass" bit line, the voltage of the bit line BL2 connected to the memory strings is set to Vm. In addition, among the plurality of memory strings MS in the same block BLK, in all the memory strings MS connected to the "pass" bit line, similarly to the memory strings MS21 and MS22 in FIG. 22, the voltage of the line BL connected to each of the memory strings is set to Vm.

In the memory strings MS21 and MS22 connected to the bit line BL2 which is a "pass" bit line, 0 V is applied to the gate of the first select transistor ST1, and Vm is applied to the drain of the first select transistor ST1. In this state, in each one of the memory strings MS21 and MS22, the voltage difference between the drain and the gate of the first select transistor ST1 does not become large enough to cause GIDL, so that the holes h+ do not occur.

As a result, in the memory strings MS21 and MS22, the voltages of the respective channels are raised up to Vm. That is, the memory strings are in the state similar to that of the memory string MS22 in the example of FIG. 11. For this reason, in the memory strings MS21 and MS22, additional erasing is not performed for the memory cell transistors MT.

In this manner, the memory string MS connected to the "pass" bit line is excluded from the erase targets when the voltage of the "pass" bit line is set to Vm at the next erase operation.

When the erase operation and the verify operation are repeated by such a method, the sequential erase operation is prevented from being repeatedly executed for the memory cell transistor MT connected to the "pass" bit line. For this reason, as described with reference to FIG. 9, it is possible to prevent a phenomenon in which some threshold voltage becomes larger than the read pass voltage Vread.

It is noted that the memory cell transistor MT connected to the "fail" bit line may include a memory cell transistor MT in which the data erasing is successful. In such a memory cell transistor MT, there is a possibility that the erase operation is repeatedly executed even after the data erasing is successful. However, it is considered that, in the memory cell transistors MT belonging to the same layer (that is, the memory cell transistors MT connected to the same selected word line sWL), the variation in the characteristics is relatively small, there is a high possibility that the number of times of repeating the erase operation as described above is within a few times. For this reason, as described with reference to FIG. 9, in the present embodiment as well, it is possible to reliably prevent a phenomenon in which some threshold voltage becomes larger than the read pass voltage Vread.

Figure 23:
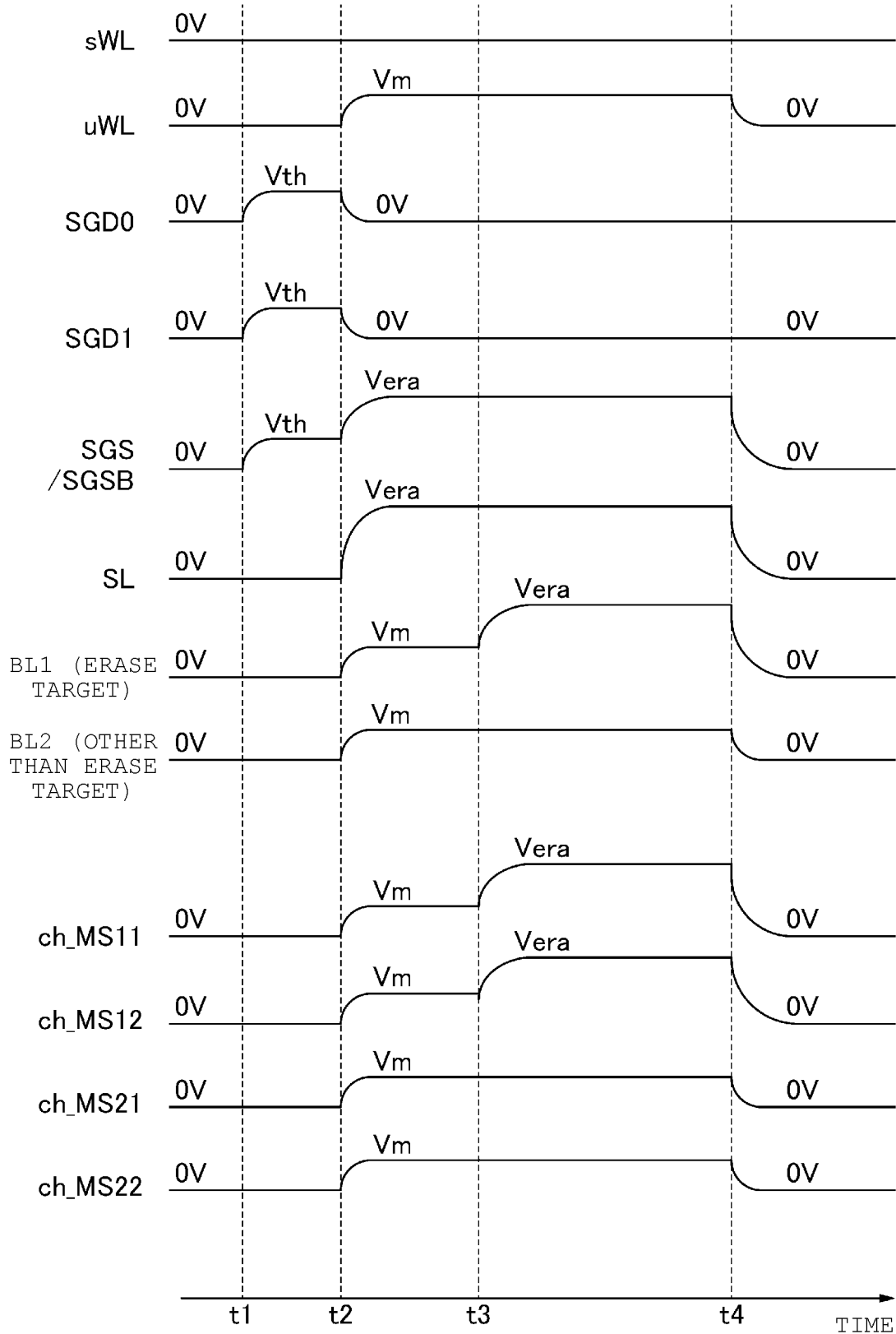
FIG. 23 is a time chart illustrating voltage changes of the respective portions during the erase operation of the fourth embodiment.

FIG. 23 illustrates an example of a time chart for setting the voltages of the respective portions to the state illustrated in FIG. 22 by the method similar to that in FIG. 14. It is noted that, among the voltage changes of the respective portions illustrated in FIG. 23, each one of the voltage changes of the respective portions in a period until the time t3 is the same as those of the first embodiment illustrated in FIG. 14.

In the present embodiment, the sequencer 41 maintains the voltage of the gate line SGD1 to be 0 V even after the time t3.

At the time t3, the sequencer 41 raises the voltage of the bit line BL1, which is a "fail" bit line, up to Vera. The same applies to the voltages of other "fail" bit lines in the same block BLK. On the other hand, the voltage of the bit line BL2, which is a "pass" bit line, is maintained at Vm even after the time t3. The same applies to the voltages of other "pass" bit lines in the same block BLK.

In the memory string MS connected to the "fail" bit line, as described above, the holes h+ occur in the first select transistor ST1. For this reason, the voltages of the channels (ch_MS11 and ch_MS12 in the example of FIG. 23) in the memory string MS are raised up to Vera after the time t3.

On the other hand, in the memory string MS connected to the "pass" bit line, as described above, the holes h+ do not occur in the first select transistor ST1. For this reason, the voltages of the channels (ch_MS21 and ch_MS22 in the example of FIG. 23) in the memory string MS are maintained to be Vm even after the time t3.

By performing the processes described above, the voltages of the respective portions when the erase operation is performed have a distribution as illustrated in FIG. 22. This state is maintained until the time t4 when the erase operation is ended. At the time t4, each one of the voltages of the respective portions such as the selected word lines sWL is set to 0 V.

It is noted that, when the first erase operation is to be performed, the voltage distribution as illustrated in FIG. 20 can be obtained by changing the voltage of the bit line BL2 to be similar to the voltage of the bit line BL1.

Figure 24:
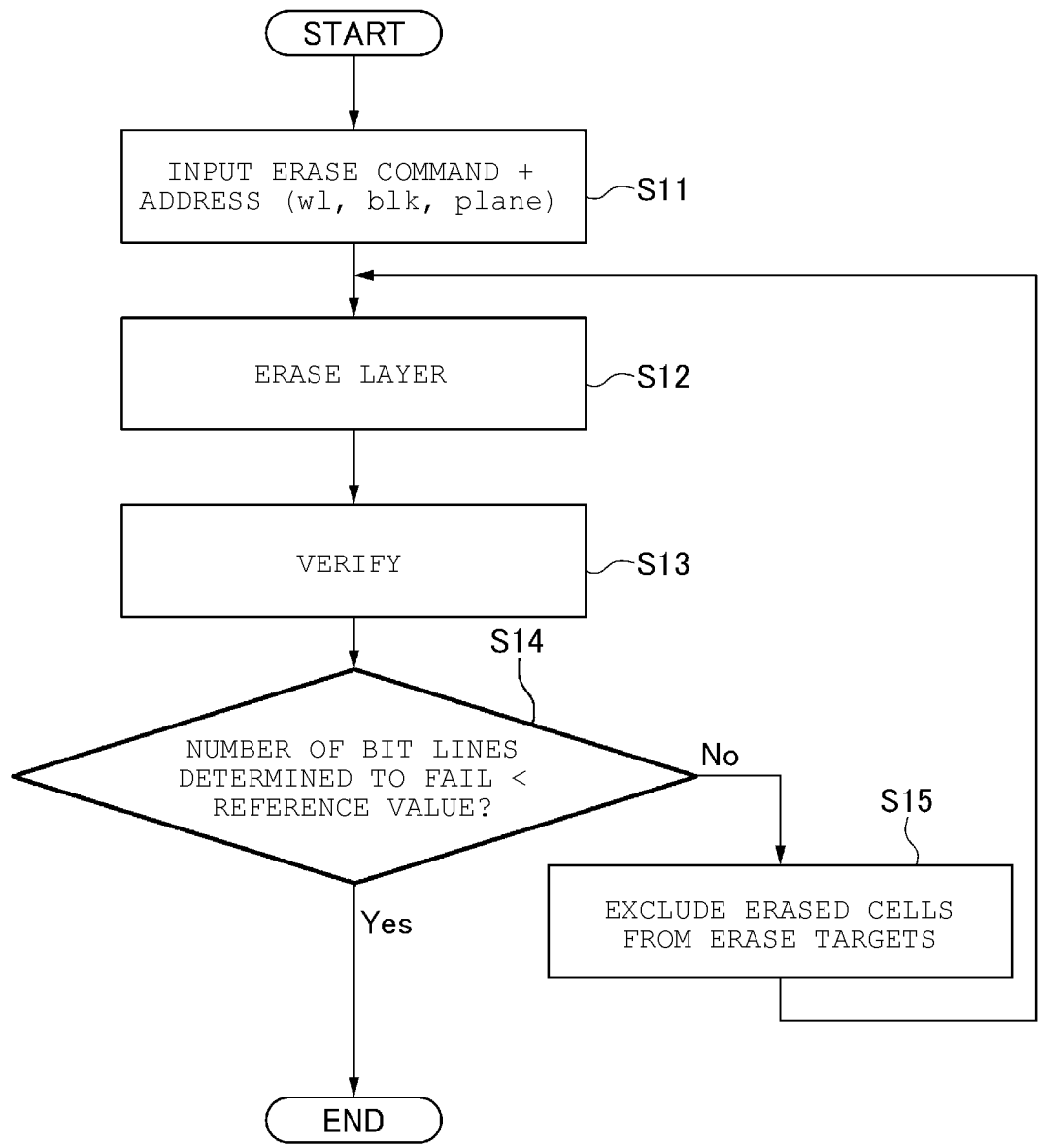
FIG. 24 is a flowchart illustrating a flow of processes executed by the sequencer of the fourth embodiment.

The flow of processes executed for the selective erasing will be described with reference to FIG. 24. The series of the processes illustrated in FIG. 24 is executed by the sequencer 41 of the present embodiment instead of a series of the processes illustrated in FIG. 15.

In S11, which is the first step of the process, the erase command from the memory controller 1 is input to the interface circuit 20 of the semiconductor storage device 2. The erase command is a command for erasing a specific layer in the semiconductor storage device 2. An address for specifying the erase target together with the erase command is also input to the interface circuit 20. The address includes various signals configured with wl, blk, and plane.

In S12, which is a step subsequent to S11, the erase operation is executed by setting the layer designated in S11 as the erase target. When the erase operation of S12 is to be first executed, the erase operation is executed by setting all the memory cell transistors MT belonging to the group of erase targets as the targets by the method similar to the method described with reference to FIG. 20. Specifically, after setting the voltages of all the bit lines BL in the block BLK to Vera, the erase operation is executed.

In S13, which is a step subsequent to S12, the verify operation is executed by setting the page designated in S11 as the target. Herein, it is determined whether or not the threshold voltage of each memory cell transistor MT belonging to the group of erase targets is larger than the verify voltage Vevfy by the method similar to the method described with reference to FIG. 21. Specifically, it is determined whether each bit line BL is the "pass" bit line or the "fail" bit line.

In S14, which is a step subsequent to S13, it is determined whether or not the number of bit lines BL determined to be the "fail" bit lines in the verify operation of S13 is smaller than a predetermined reference value. The "reference value" referred to herein is a preset value as an upper limit value of the number of "fail" bit lines so as not to cause a problem in the operation of the semiconductor storage device 2. When the number of bit lines BL determined to be the "fail" bit lines in the verify operation of S13 falls below the reference value, a series of the processes illustrated in FIG. 24 are ended. In this case, a series of the processes for erasing the layer in accordance with the command of S11 are ended.

When the number of bit lines BL determined to be the "fail" bit lines in the verify operation of S13 is equal to or greater than the reference value, the process proceeds to S15. In S15, a process of excluding the memory cell transistor MT connected to the bit line BL determined to be the "pass" bit line in the verify operation of S13 from the erase targets in the next erase operation is performed. After that, the processes subsequent to S12 are executed again.

When the erase operation of S12 is to be executed again, in the memory string MS including the memory cell transistors MT excluded from the erase targets, similarly to the memory strings MS21 and MS22 in the example of FIG. 22, the voltage of the bit line BL (that is, the "pass" bit line) connected to the memory string MS is set to Vm instead of Vera. For this reason, a large voltage such as −Vera is not applied between the gate and the channel of the memory cell transistors MT excluded from the erase targets. A large voltage such as −Vera is applied only between the gate and the channel of the memory cell transistor MT that is a subsequent erase target.

The erase operation of S12 and the verify operation of S13 are repeatedly executed until the number of bit lines BL determined to be the "fail" bit lines in the verify operation falls below the reference value.

It is noted that, in the fourth embodiment as well, similarly to the second embodiment, the erase operation may be performed while setting each of the gate line SGSB and the source line SL to the third voltage (Vm). In addition, similarly to the third embodiment, the erase operation may be performed while setting the third voltage to Vm− a, which is smaller than Vm.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a memory cell array including a plurality of first memory strings, each of which is connected between one of a plurality of bit lines and a source line and includes a first select transistor, a second select transistor, and a plurality of memory cell transistors that are connected in series between the first select transistor and the second select transistor, the memory cell array further including a plurality of word lines respectively connected to gates of the memory cell transistors in each first memory string; and
a control circuit configured to control an operation of the memory cell array, including an erase operation, wherein
a threshold voltage of each memory cell transistor is increased when a voltage that is applied to a word line connected to the gate thereof is lower than a voltage of a channel thereof, and
in the erase operation, data stored in the memory cell transistors connected to a selected one of the word lines are erased while data stored in the memory cell transistors not connected to the selected word line are not erased.

2. The semiconductor storage device according to claim 1, wherein
the erase operation includes a plurality of loops of an erase voltage apply operation for erasing the data stored in the memory cell transistors connected to the selected word line, and a verify operation for verifying a result of the erase voltage apply operation, and the memory cell transistors in which data is determined to have been erased in the verify operation are excluded from the next loop of the erase operation.

3. The semiconductor storage device according to claim 2, wherein, during the next loop of the erase operation:
a first voltage is applied to the selected word line,
the channel of each of the first memory strings for the memory cell transistors that have not been excluded from the next loop of the erase operation is set to a second voltage that is higher than the first voltage, and
the channel of each of the first memory strings for the memory cell transistors that have been excluded from the next loop of the erase operation is set to a third voltage that is higher than the first voltage and lower than the second voltage.

4. The semiconductor storage device according to claim 3, wherein, during the next loop of the erase operation:
a fourth voltage that is higher than the third voltage and lower than the second voltage, is applied to the word lines that are not the selected word line.

5. The semiconductor storage device according to claim 4, wherein, during the next loop of the erase operation:
before the fourth voltage is applied to the word lines that are not the selected word line, the channel of each of the first memory strings for the memory cell transistors that have been excluded from the next loop of the erase operation is set to a fifth voltage that is lower than the first voltage.

6. The semiconductor storage device according to claim 1, wherein
the memory cell array further includes a plurality of second memory strings, each of which is connected between one of the plurality of bit lines and the source line and includes a first select transistor, a second select transistor, and a plurality of memory cell transistors that are connected in series between the first select transistor and the second select transistor, and the plurality of word lines are respectively connected to gates of the memory cell transistors in each second memory string, and
in the erase operation, data stored in the memory cell transistors of the first memory strings and the second memory strings that are connected to the selected word line are erased, while data stored in other memory cell transistors of the first memory strings and the second memory strings that are connected to the word lines that are not the selected word line, are not erased.

7. The semiconductor storage device according to claim 1, wherein
the memory cell array further includes a plurality of second memory strings, each of which is connected between one of the plurality of bit lines and the source line and includes a first select transistor, a second select transistor, and a plurality of memory cell transistors that are connected in series between the first select transistor and the second select transistor, and the plurality of word lines are respectively connected to gates of the memory cell transistors in each second memory string, and
in the erase operation, data stored in the memory cell transistors of the first memory strings that are connected to the selected word line are erased, while data stored in the memory cell transistors of the second memory strings that are connected to the selected word line are not erased, and
in the erase operation, a first voltage is applied to the selected word line, the channel of each of the first memory strings is set to a second voltage that is higher than the first voltage, and the channel of each of the second memory strings is set to a third voltage that is higher than the first voltage and lower than the second voltage.

8. The semiconductor storage device according to claim 7, wherein
each of the first and second memory strings includes a third select transistor between the second select transistor and the source line, and
in the erase operation, the second voltage is applied to gates of the second select transistors and the third voltage is applied to gates of the third select transistors.

9. The semiconductor storage device according to claim 7, wherein, in the erase operation:
the channel of each of the second memory strings is set to be in a floating state, and after that, a fourth voltage is applied to the word lines that are not the selected word line.

10. The semiconductor storage device according to claim 9, wherein
before the fourth voltage is applied to the word lines that are not the selected word line, the channel of each of the second memory strings is set to a fifth voltage that is lower than the first voltage.

11. A method of performing an erase operation in a semiconductor storage device comprising a memory cell array including a plurality of first memory strings, each of which is connected between one of a plurality of bit lines and a source line and includes a first select transistor, a second select transistor, and a plurality of memory cell transistors that are connected in series between the first select transistor and the second select transistor, the memory cell array further including a plurality of word lines respectively connected to gates of the memory cell transistors in each first memory string, wherein a threshold voltage of each memory cell transistor is increased when a voltage that is applied to a word line connected to the gate thereof is lower than a voltage of a channel thereof, said method comprising:
erasing data stored in first memory cell transistors of the first memory strings connected to a selected one of the word lines by increasing the threshold voltage of the first memory cell transistors while retaining data stored in second memory cell transistors of the first memory strings that are not connected to the selected word line.

12. The method according to claim 11, wherein
the erase operation includes a plurality of loops of an erase voltage apply operation for increasing the threshold voltage of the first memory cell transistors, and a verify operation for verifying a result of the erase voltage apply operation, and
the first memory cell transistors in which data is determined to have been erased in the verify operation are excluded from the next loop of the erase operation.

13. The method according to claim 12, wherein, during the next loop of the erase operation:
a first voltage is applied to the selected word line,
the channel of each of the first memory strings for the first memory cell transistors that have not been excluded from the next loop of the erase operation is set to a second voltage that is higher than the first voltage, and
the channel of each of the first memory strings for the first memory cell transistors that have been excluded from the next loop of the erase operation is set to a third voltage that is higher than the first voltage and lower than the second voltage.

14. The method according to claim 13, wherein, during the next loop of the erase operation:
a fourth voltage that is higher than the third voltage and lower than the second voltage, is applied to the word lines that are not the selected word line.

15. The method according to claim 14, wherein, during the next loop of the erase operation:
before the fourth voltage is applied to the word lines that are not the selected word line, the channel of each of the first memory strings for the first memory cell transistors that have been excluded from the next loop of the erase operation is set to a fifth voltage that is lower than the first voltage.

16. The method according to claim 11, wherein
the memory cell array further includes a plurality of second memory strings, each of which is connected between one of the plurality of bit lines and the source line and includes a first select transistor, a second select transistor, and a plurality of memory cell transistors that are connected in series between the first select transistor and the second select transistor, and the plurality of word lines are respectively connected to gates of the memory cell transistors in each second memory string, said method further comprising:
erasing data stored in third memory cell transistors of the second memory strings connected to the selected word line by increasing the threshold voltage of the third memory cell transistors while retaining data stored in fourth memory cell transistors of the second memory strings that are not connected to the selected word line.

17. The method according to claim 11, wherein
the memory cell array further includes a plurality of second memory strings, each of which is connected between one of the plurality of bit lines and the source line and includes a first select transistor, a second select transistor, and a plurality of memory cell transistors that are connected in series between the first select transistor and the second select transistor, and the plurality of word lines are respectively connected to gates of the memory cell transistors in each second memory string, and
in the erase operation, a first voltage is applied to the selected word line, the channel of each of the first memory strings is set to a second voltage that is higher than the first voltage, and the channel of each of the second memory strings is set to a third voltage that is higher than the first voltage and lower than the second voltage.

18. The method according to claim 17, wherein
each of the first and second memory strings includes a third select transistor between the second select transistor and the source line, and
in the erase operation, the second voltage is applied to gates of the second select transistors and the third voltage is applied to gates of the third select transistors.

19. The method according to claim 17, wherein, in the erase operation:
the channel of each of the second memory strings is set to be in a floating state, and after that, a fourth voltage is applied to the word lines that are not the selected word line.

20. The method according to claim 19, wherein before the fourth voltage is applied to the word lines that are not the selected word line, the channel of each of the second memory strings is set to a fifth voltage that is lower than the first voltage.

* * * * *